(12) United States Patent
Sakai et al.

(10) Patent No.: US 7,632,164 B2
(45) Date of Patent: *Dec. 15, 2009

(54) PROCESS FOR PRODUCING AN ORGANIC EL DISPLAY DEVICE USING DIFFERENT PROCESSING UNITS FOR EACH OF THE MANUFACTURING STAGES

(75) Inventors: Toshio Sakai, Sodegaura (JP); Mitsuru Eida, Sodegaura (JP); Hiroshi Tokailin, Sodegaura (JP)

(73) Assignee: Panasonic Corporation, Osaka (JP)

( * ) Notice: Subject to any disclaimer, the term of this patent is extended or adjusted under 35 U.S.C. 154(b) by 341 days.

This patent is subject to a terminal disclaimer.

(21) Appl. No.: 11/715,915

(22) Filed: Mar. 9, 2007

(65) Prior Publication Data

US 2007/0167103 A1    Jul. 19, 2007

Related U.S. Application Data

(60) Division of application No. 10/802,802, filed on Mar. 18, 2004, now Pat. No. 7,210,979, which is a continuation of application No. 09/809,244, filed on Mar. 16, 2001, now Pat. No. 6,786,789.

(30) Foreign Application Priority Data

Mar. 22, 2000   (JP) .............................. 2000-080798

(51) Int. Cl.
*H01J 9/00* (2006.01)
*H01L 51/56* (2006.01)
*C23C 16/00* (2006.01)

(52) U.S. Cl. ............................. 445/25; 445/24; 427/66; 118/729; 118/733; 118/728

(58) Field of Classification Search .................. 445/24, 445/25; 427/66, 64; 118/128, 729, 733
See application file for complete search history.

(56) References Cited

U.S. PATENT DOCUMENTS 5,433,639 A    7/1995   Zahuta et al.

(Continued)

FOREIGN PATENT DOCUMENTS

EP             0 859 539 A2    8/1998

(Continued)

OTHER PUBLICATIONS

EL, pp. 168-172 (1998).

*Primary Examiner*—Mariceli Santiago
(74) *Attorney, Agent, or Firm*—Steptoe & Johnson LLP

(57) ABSTRACT

An apparatus and a corresponding process for producing an organic EL display device comprising a first unit for carrying a supporting substrate in, a second unit for heating at least the supporting substrate before forming an organic luminescence medium, thereby performing a dehydration treatment, a third unit for forming the organic luminescence medium and an upper element, and a fourth unit for sealing the periphery of the apparatus with a sealing member, wherein the first unit is arranged between the second unit and the third unit, a first carrying device is set up in the first unit, and a second carrying device is arranged between the third unit and the fourth unit.

7 Claims, 15 Drawing Sheets

U.S. PATENT DOCUMENTS

| | | | |
|---|---|---|---|
| 5,817,366 A | 10/1998 | Arai et al. | |
| 6,049,167 A | 4/2000 | Onitsuka et al. | |
| 6,132,280 A | 10/2000 | Tanabe et al. | |
| 6,326,726 B1 | 12/2001 | Mizutani et al. | 313/504 |
| 6,390,874 B2 | 5/2002 | Mizutani et al. | 445/24 |
| 6,776,880 B1 | 8/2004 | Yamazaki | |
| 2001/0006827 A1* | 7/2001 | Yamazaki et al. | 427/68 |

FOREIGN PATENT DOCUMENTS

| | | |
|---|---|---|
| EP | 0 865 229 A2 | 9/1998 |
| EP | 1 071 117 A2 | 1/2001 |
| EP | 1 176 850 A1 | 1/2002 |
| JP | 8-111285 | 4/1996 |
| JP | 10-214682 | 8/1998 |
| JP | 10255972 A * | 9/1998 |
| JP | 10-335061 | 12/1998 |
| JP | 10335061 A * | 12/1998 |
| JP | 11-126686 | 5/1999 |
| JP | 2000-133446 | 5/2000 |
| JP | 2000-150147 | 5/2000 |
| JP | 2000-182766 | 6/2000 |
| JP | 2000-357586 | 12/2000 |
| KR | 1998-071583 | 10/1998 |

* cited by examiner

PROCESS FOR PRODUCING AN ORGANIC EL DISPLAY DEVICE USING DIFFERENT PROCESSING UNITS FOR EACH OF THE MANUFACTURING STAGES

REFERENCE TO RELATED APPLICATIONS

This application is a divisional of application Ser. No. 10/802,802 filed Mar. 18, 2004 now U.S. Pat. No. 7,210,979, issued on May 1, 2007, which is a continuation of application Ser. No. 09/809,244 filed Mar. 16, 2001, now U.S. Pat. No. 6,786,789, issued on Sep. 7, 2004, which claims the benefit of Japanese Application No. 2000-080798 filed Mar. 22, 2002, the entire disclosure of which is incorporated by reference herein.

BACKGROUND OF THE INVENTION

1. Field of the Invention

The present invention relates to an apparatus for producing an organic EL display device, and a process for producing an organic EL display device. More specifically, the present invention relates to a producing apparatus making it possible to produce an organic EL display device capable of suppressing the generation of non-luminescence areas or non-luminescence spots, which may be referred to dark spots, in pixels; and a process for producing such an organic EL display device.

The "EL" described in the claims and the specification is an abbreviation of "electroluminescence".

2. Description of the Related Art

Hitherto, various sealing means and moisture-proof means in organic EL display devices have been investigated to exclude the effect of moisture in the atmosphere and suppress the generation of non-luminescence areas, non-luminescence spots and the like in luminescence areas at the time of driving the devices.

It is also studied that an organic EL display device is produced without being exposed to the atmosphere. Such a producing apparatus is disclosed in JP-A-No. 8-111285, 10-214682 or 10-335061.

As illustrated in FIG. 20, in a producing apparatus 250 for an organic EL display device disclosed in JP-A-No. 8-111285, plural vacuum chambers 111 to 116 for working are connected to the periphery of a vacuum device 110. A movable arm 102 for carriage is disposed inside the vacuum device. Thus, a substrate 104 can be moved while the vacuum device and the working vacuum chambers are under a reduced pressure condition.

Therefore, respective layers of an organic EL element can be formed on the substrate in the respective working vacuum chambers while the substrate is passed through the single vacuum device. In other words, an organic EL display device can be produced without being exposed to the atmosphere from the respective film-depositing step to the step of forming a protective film.

As illustrated in FIG. 21, an apparatus for producing an organic EL display device disclosed in JP-A-No. 10-214682 comprises independent 1st-nth working vacuum chambers 222a to 226a, and 1st-nth carrying vacuum chambers 222 to 226 connected to the working vacuum chambers through gate valves 222d to 226d, respectively. The carrying vacuum chambers 222 to 226 are horizontally connected to each other through gate valves 222c to 227c. A substrate and so on can be transferred from a first dry box 221, which is an inlet, to a second dry box 227, which is an outlet, by means of robot arms 222b to 226b set up in the respective carrying vacuum chambers.

Accordingly, it is possible that respective layers of an organic EL element are formed in the respective working vacuum chambers and the unfinished organic EL element can be successively moved in the respective working vacuum chambers through the carrying vacuum chambers while the working vacuum chambers are in a reduced pressure state. In short, an organic EL display device can be produced without being exposed to the atmosphere from the step of depositing its films to a sealing step.

As illustrated in FIG. 22, an apparatus for producing an organic EL display device, disclosed in JP-A-No. 10-335061, comprises a vacuum chamber 315, a vacuum device 307 connected to the vacuum chamber, a carrying and pressing means 316 for carrying an organic EL element 309 or a sealing member 312 in the vacuum chamber, a hardening means 311 for hardening an adhesive layer 313 between the organic EL element 309 and the sealing member 312.

It is therefore possible to form respective layers of the organic EL element inside the vacuum chamber 315 and further harden the adhesive layer 313 with the hardening means (ultraviolet-ray exposure device) 311 in the state that the sealing member 312 prepared inside the vacuum chamber is positioned and then pressed from the above by means of the carrying and pressing means 316. In short, an organic EL display device can be produced without being exposed to the atmosphere from the step of depositing its films to a sealing step.

However, in the organic EL display device producing apparatus disclosed in JP-A-No. 8-111285, the number of the working vacuum chambers (vapor-depositing chambers or sputtering chambers) arranged around its vacuum tank is as large as, for example, five. Thus, a problem that the producing apparatus becomes large-sized arises.

No unit for removing water from an organic EL wafer wherein a transparent element, an organic film and so on are formed on a glass substrate is set up. It is therefore difficult to lower the water content in an organic luminescence medium in the resultant organic EL display device. Thus, a problem that dark spots as non-luminescence areas are easily generated arises.

A problem that sealing is insufficient is also caused since a protective film is formed on the organic EL wafer and subsequently the resultant is exposed to the air.

The organic EL display device producing apparatus disclosed in JP-A-No. 10-214682 comprises the 1st-nth working vacuum chambers, the 1st-nth carrying vacuum chambers and the first and second dry boxes, and they are horizontally connected to each other. Thus, this apparatus has a problem that it becomes markedly large-size.

This producing apparatus has the first dry box. However, the first dry box is a space where the water content is controlled into a low value and no heating device is set up. Thus, water contained in a substrate and so on cannot be positively removed.

Therefore, it is difficult to lower the water content in the organic luminescence medium in the resultant organic EL display device. Thus, it has still been difficult to suppress the generation of dark spots and so on as non-luminescence areas and obtain a high luminescence brightness for a long time.

The organic EL display device producing apparatus disclosed in JP-A-No. 10-335061 has no water-removing means, that is, no function for removing water contained in a substrate and so on positively. Therefore, it is difficult to lower the water content in the organic luminescence medium in the resultant organic EL display device. Thus, it has still been difficult to suppress the generation of dark spots and so on as non-luminescence areas and obtain a high luminescence brightness for a long time.

As illustrated in FIG. 23, an organic EL display device producing apparatus 400 disclosed in JP-A-No. 2000-133446 comprises load side receipt chambers 412 and 413, a load side normal-pressure carrying chamber 411, a load chamber 421, a vacuum carrying chamber 431, film-depositing chambers 432 to 435, an unload chamber 441, an unload side normal-pressure carrying chamber 451, unload side receipt chambers 452 and 453, and an airtight working chamber 454, and is characterized in that an inert gas atmosphere having a water content of 100 ppm or less is filled at least into the unload chamber 441 and the unload side normal-pressure carrying chamber 451. JP-A-No. 2000-133446 also discloses that in the load side receipt chambers 412 and 413, a substrate and any organic material on the substrate are preferably heated to remove water from them.

However, in the disclosed organic EL display device producing apparatus, the position into which the substrate is carried and the position in which the substrate is heated are common. Therefore, the apparatus has a problem that in the case in which the load side receipt chamber is once heated, a next substrate cannot be carried thereinto until the temperature of the load side receipt chamber falls. Since the position into which a substrate is carried and the position in which the substrate is heated are common and further the load side normal-pressure carrying chamber is arranged after the heated load side receipt chamber, it is difficult to reduce the pressure of the load side receipt chamber, cool the chamber, or set up a precision balance therein. Therefore, a problem that it takes much time to remove water from the substrate and so on sufficiently or carry out a dehydration step arises.

Thus, it is suggested that plural load side receipt chambers are disposed. However, there arise problems that the whole of the producing apparatus including a heating device and a precision balance becomes large-scaled and the performances of resultant organic EL display devices are scattered because of a scattering in heating temperatures in the load-side receipt chambers.

Furthermore, in the disclosed organic EL display device producing apparatuses, the position into which a substrate is carried and the position in which the substrate is heated are common. Therefore, it is impossible a that the position where the substrate is heated and the position where the substrate is cleaned are conversely made common. Thus, the apparatuses have problems that the whole of the apparatuses increasingly becomes large-scaled and further the substrate absorbs water at the time of the transfer of the substrate from the substrate-heating position to the substrate-cleaning device so that dehydration effect is lowered.

Thus, the inventors eagerly made further investigations on such problems. As a result, it has been found that by setting up a water-removing unit separately from the position into which a supporting substrate is carried and removing water positively from the substrate and so on through heating treatment, the water content in an organic luminescence medium can be markedly lowered, so that the generation of dark spots and the like, as non-luminescence areas, around pixels can be greatly suppressed.

Therefore, an object of the present invention is to provide an organic EL display device producing apparatus making it possible to obtain effectively an organic EL display device capable of suppressing the generation of dark spots and the like even if the device is driven for a long time.

Another object of the present invention is to provide an organic EL display device producing process making it possible to obtain effectively an organic EL display device capable of suppressing the generation of dark spots and the like even if the device is driven for a long time.

SUMMARY OF THE INVENTION

[1] According to the present invention, provided is an apparatus for producing an organic EL display device which has at least a lower electrode, an organic luminescence medium and an upper electrode, on the supporting substrate, and the periphery of the device being sealed with a sealing member, the apparatus comprising:

a first unit for carrying the supporting substrate in, a second unit for heating at least the supporting substrate before forming the organic luminescence medium, thereby conducting a dehydration treatment, a third unit for forming the organic luminescence medium and the upper electrode, and a fourth unit for sealing the periphery with the sealing member, and carrying units being set up between the respective units. Thus, the above-mentioned problems can be solved.

Namely, this producing apparatus is made to comprise the second unit for conducting the dehydrating treatment positively, which is different from the location into which the substrate is carried. Therefore, the water content in the organic luminescence medium after the organic EL display device is fabricated is easily adjusted. Thus, it is possible to obtain easily the organic EL display device superior in endurance wherein the generation of dark spots and the like as non-luminescence areas is markedly reduced.

[2] In the organic EL display device producing apparatus of the present invention, it is preferred that the first unit is arranged between the second unit and the third unit.

According to this producing apparatus, the substrate and so on can be repeatedly reciprocated between the second unit and the third unit through the first unit. Therefore, film-deposition and dehydration can be repeated any number of times.

According to this producing apparatus, the first unit can function as a buffer at the time of the heating in the second unit and a reduction in the pressure in the third unit.

[3] In the organic EL display device producing apparatus of the present invention, it is preferred that the second unit is composed of a heating room and a cooling room.

This structure makes it possible to cool the substrate promptly in the cooling room even if the substrate is heated under a reduced-pressure in the heating room.

[4] In the organic EL display device producing apparatus of the present invention, it is preferred that the second unit is provided with at least one of an inert gas circulating device, a pressure-reducing device, and a cooling device.

This structure makes it possible to use the inert gas while the dehydrating treatment by heating is conducted. Therefore, the dehydrating treatment can be more effectively conducted in the state that the organic EL display device is not substantially exposed to the atmosphere.

This structure also makes it possible to conduct the dehydrating treatment by heating in a reduced pressure state. Therefore, the dehydrating treatment can be made more effective.

This structure also makes it possible to cool the substrate easily after the dehydrating treatment by heating. Therefore, the time until the substrate is transferred to the next step can be markedly reduced. In the case that the dehydrating treatment by heating is conducted in a reduced pressure state, natural cooling does not advance. Thus, this cooling device is a particularly effective means.

[5] In the organic EL display device producing apparatus of the present invention, it is preferred that the first unit is provided with at least one of an inert gas circulating device, a pressure-reducing device, and a cooling device.

This structure makes it possible to use the inert gas in the first unit. Thus, the substrate and so on are not exposed to the atmosphere when they are transferred or cooled.

This structure also makes it possible to make the first unit into a reduced pressured state. Therefore, the substrate and so on can be transferred to the third unit in a reduced pressure state.

This structure also makes it possible to cool easily the substrate in the first unit after the dehydrating treatment by heating in the second unit. Thus, the time until the substrate is transferred to the next step can be markedly reduced.

[6] In the organic EL display device producing apparatus of the present invention, it is preferred that the fourth unit is connected to the first unit.

This structure makes it possible to arrange the 1st to 4th units in a radiant state and make the first carrying unit in common with the second carrying unit. Thus, the producing apparatus can be made small.

[7] In the organic EL display device producing apparatus of the present invention, it is preferred that the second unit is made in common with the fourth unit.

This structure makes it possible to save spaces for the first and fourth units. Thus, the producing apparatus can be made smaller.

[8] In the organic EL display device producing apparatus of the present invention, it is preferred that the third unit is a vacuum evaporation device having plural evaporation sources for evaporating plural samples simultaneously or successively.

This structure makes it possible to form the respective layers of the organic EL element while a given vacuum state is kept. Therefore, the water content in the organic luminescence medium can easily be adjusted. Moreover, the producing apparatus can be made smaller than the case in which the third unit is composed of plural evaporation devices and so on.

In order to obtain the organic luminescence medium and so on that have a uniform thickness, the substrate and the plural evaporation sources are preferably rotated independently.

[9] In the organic EL display device producing apparatus of the present invention, it is preferred that the third unit comprises a buffer room, a vacuum evaporation device, and a sputtering device.

This structure makes it possible to select appropriately the method for depositing each of the layers of the organic EL element dependently on the kind of the material thereof.

Since the buffer room is set up, the vacuum evaporation device can be connected to the sputtering device through the buffer room. Therefore, the degree of vacuum in the respective rooms can easily be adjusted.

The use of this buffer room makes replacement of plural substrates possible. Therefore, it is easy to different substrates simultaneously in the vacuum evaporation device and the sputtering device.

[10] In the organic EL display device producing apparatus of the present invention, it is preferred that the third unit further comprises a plasma-cleaning device. This structure makes it possible to make the organic EL display device more minute and better in endurance.

[11] Another embodiment of the present invention is a process for producing an organic EL display device, using any one of the above-mentioned producing apparatuses, comprises the steps of:

carrying a supporting substrate into the first unit, using the carrying device to transfer the carried-in supporting substrate from the first unit to the second unit, heating the transferred supporting substrate in the second unit to conduct a dehydrating treatment, using the carrying device to transfer the dehydrated supporting substrate from the second unit to the third unit, forming an organic luminescence medium and an upper electrode in the third unit, using the carrying device to transfer the supporting substrate on which the organic luminescence medium and the upper electrode are formed from the third unit to the fourth unit, and sealing the periphery of the organic EL display device with a sealing member in the fourth unit.

This process makes it easy to adjust the water content in the organic luminescence medium after the organic EL display device is fabricated. It is therefore possible to obtain effectively the organic EL display device wherein the generation of dark spots and the like is markedly reduced.

[12] In the organic EL display device producing process of the present invention, it is preferred that the second unit comprises a heating room and a cooling room, the supporting substrate is heated in the heating room to conduct a dehydrating treatment, and the dehydrated supporting substrate is cooled in the cooling room.

The process makes it possible to cool the substrate easily in the cooling room of the second unit even if the substrate is heated and dehydrated in a reduced pressure state in the heating room of the second unit. Thus, the time for producing the organic EL display device can be made short.

[13] A further embodiment of the present invention is a process for producing an organic EL display device, using the above-mentioned producing apparatus, comprises the steps of:

carrying a supporting substrate into the first unit, using the carrying device to transfer the carried-in supporting substrate from the first unit to the second unit, heating the transferred supporting substrate in the second unit to conduct a dehydrating treatment, using the carrying device to transfer the dehydrated supporting substrate from the second unit to the third unit through the first unit, forming an organic luminescence medium and an upper electrode in the third unit, using the carrying device to transfer the supporting substrate on which the organic luminescence medium and the upper electrode are formed from the third unit to the fourth unit, and sealing the periphery of the organic EL display device with a sealing member in the fourth unit.

Since there is used the producing apparatus wherein the place which the supporting substrate is carried into and the place which the substrate is dehydrated are different from each other, the producing time can be made short. Moreover, the flexibility of the arrangement of the producing apparatus is improved. Furthermore, the water content in the organic luminescence medium can easily be adjusted.

[14] A still further embodiment of the present invention is a process for producing an organic EL display device, using the above-mentioned producing apparatus, comprises the steps of:

carrying a supporting substrate into the first unit, using the carrying device to transfer the carried-in supporting substrate from the first unit to the second unit, heating the transferred supporting substrate in the second unit to conduct a dehydrating treatment, using the carrying device to transfer the dehydrated supporting substrate from the second unit to the third unit through the first unit, forming an organic luminescence medium and an upper electrode in the third unit, using the carrying device to transfer the supporting substrate on which the organic luminescence medium and the upper electrode are formed from the third unit to the fourth unit via the first unit, and sealing the periphery of the organic EL display device with a sealing member in the fourth unit.

This process makes it possible to make the producing time short, improve the flexibility of the arrangement of the producing apparatus, and make the adjustment of the water content in the organic luminescence medium easy.

[15] An additional embodiment of the present invention is a process for producing an organic EL display device, using the above-mentioned producing apparatus, comprises the steps of:

carrying a supporting substrate into the first unit, using the carrying device to transfer the carried-in supporting substrate from the first unit to the second unit, heating the transferred supporting substrate in the second unit to conduct a dehydrating treatment, using the carrying device to transfer the dehydrated supporting substrate from the second unit to the third unit, forming an organic luminescence medium and an upper electrode in the third unit, using the carrying device to transfer the supporting substrate on which the organic luminescence medium and the upper electrode are formed from the third unit to the fourth unit which is in common with the second unit through the first unit, and sealing the periphery of the organic EL display device with a sealing member in the fourth unit.

This process makes it possible to make the producing time short, improve the flexibility of the arrangement of the producing apparatus, and make the adjustment of the water content in the organic luminescence medium easy.

[16] In the organic EL display device producing process of the present invention, it is preferred that the supporting substrate dehydrated in the second unit is transferred to the first unit and cooled, and subsequently the supporting substrate is transferred to the third unit.

The cooling in the first unit in this way makes it possible to cool the supporting substrate effectively even if the substrate is dehydrated in a reduced pressured state in the second unit. Thus, the time until the substrate is transferred to the third unit can be shortened.

The cooling of the substrate dehydrated in the first unit makes it possible to dehydrate another substrate simultaneously in the second unit. Thus, productive efficiency can be improved.

[17] In the organic EL display device producing process of the present invention, it is preferred that the organic luminescence medium is formed in the third unit; the supporting substrate on which the organic luminescence medium is formed is then transferred to the second unit to conduct the dehydrating treatment; and subsequently the supporting substrate is again transferred to the third unit to form the upper electrode.

This process makes it easier to adjust the water content in the organic luminescence medium after the organic EL display device is fabricated. It is therefore possible to obtain effectively the organic EL display device wherein the generation of dark spots and the like is markedly reduced.

[18] In the organic EL display device producing process of the present invention, it is preferred that the water content in the organic luminescence medium after the sealing with sealing member is performed is set to 0.05% or less by weight.

This process makes it possible to obtain effectively the organic EL display device wherein the generation of dark spots and the like is markedly reduced under the storage not only at room temperature but also at a high temperature (for example, 80° C.).

DETAILED DESCRIPTION OF THE PREFERRED EMBODIMENTS

Figure 1:
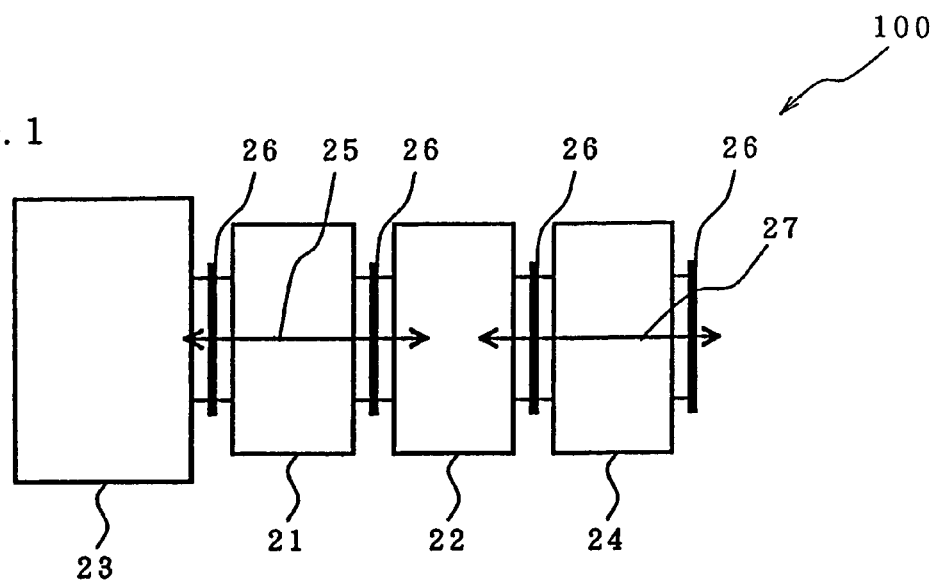
FIG. 1 is a view illustrating an apparatus for producing an organic EL display device (No. 1)

Referring to the drawings, embodiments of the present invention will be specifically described hereinafter. The drawings, which are referred to, merely illustrate the size, shape and arrangement relationship of producing apparatuses schematically to such an extent that the present invention can be understood. Therefore, the present invention is not limited to only illustrated examples. In the drawings, hatching, which represents a cross section, may be omitted.

First Embodiment

As is schematically illustrated in FIG. 1, an apparatus 100 for producing an organic EL display device in a first embodiment comprises:

a first unit 21 for carrying a supporting substrate in, a second unit 23 for heating at least the supporting substrate before forming an organic luminescence medium, thereby conducting a dehydration treatment, a third unit 22 for forming the organic luminescence medium and an upper element, and a fourth unit 24 for sealing the periphery of the device with a sealing member, wherein the first unit 21 is arranged between the second unit 23 and the third unit 22, a first carrying device 25 is set up in the first unit 21, and a second carrying device 27 is arranged between the third unit 22 and the fourth unit 24. Respective structures of the first carrying device 25 and the second carrying device 27 are not illustrated, but only moving directions thereof are represented by arrows.

Referring appropriately to FIG. 1, the following will describe the structure of the producing apparatus 100 of the first embodiment, the operation thereof, an organic EL display device obtained using this production device 100, and so on.

1. First Unit

① Function and Structure

The first unit 21 illustrated in FIG. 1 is an inlet for carrying a supporting substrate etc. in, and is a mediating space for the second unit 23 and the third unit 22. For this reason, the first unit 21 is connected to the second unit 23 and the third unit 22 through each partition 26.

Figure 10:
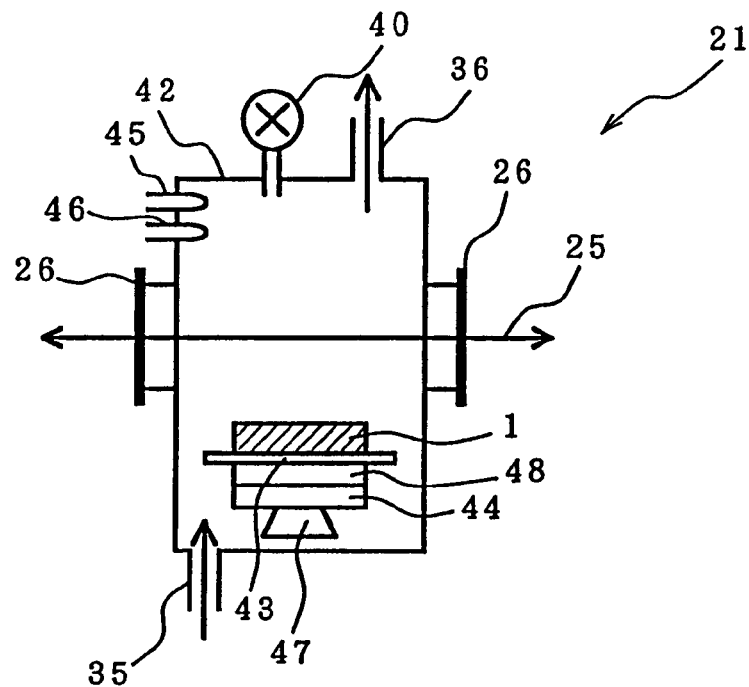
FIG. 10 is a schematic view of a first unit.

As is separately illustrated in FIG. 10, therefore, the first unit 21 preferably comprises, for example, a housing 42, a substrate stage 43, a cooling device 48, a hot plate 44, a supporting base 47, dry gas circulating devices 35 and 36, a vacuum pump 40, a dew point hydrometer 45, and full automatic absorption/desorption measuring device 46.

A non-illustrated carrying device (not shown), such as a movable arm capable of attaining reciprocating motion in the directions represented by an arrow 25 in FIG. 10, is preferably set up.

The housing 42 among these constituent members is a member for receiving at least the supporting substrate 1 and the substrate stage 43.

The hot plate 44 and the cooling device 48 are arranged below the substrate stage 43, and are made to adjust (heat or cool) the temperature of the supporting substrate 1 and so on so that the substrate and so on heated with the second unit 23 can be cooled.

The dry gas circulating device 35 and 36 are set up to prevent contact with the atmosphere by introduction of an inert gas with adjustment of the dew point with the dew point hydrometer 45.

The dew point hydrometer 45 and the full automatic moisture absorption/desorption measuring device 46 are set up since there may be a case in which the water content in a luminescence medium is measured in the first unit 21.

The first unit 21 may also be made to an outlet for carrying an organic EL display device obtained by sealing in the fourth unit 24. In other words, in the case of the producing apparatus illustrated in FIG. 1, the organic EL display device after the sealing step in the fourth unit 24 can be taken out from the fourth unit 24, but the organic EL display device can be transferred to the first unit 21 through the third unit 22 and can be taken out from the unit 21.

The volume of the first unit is preferably from ½ to ¹⁄₁₀ of that of the third unit, and is more preferably from ⅓ to ⅕ thereof.

This is because if the volume of the first unit is more than ½ of that of the third unit, it may take excessively much time to lower the vacuum degree of the first unit when a substrate and so on are transferred from the first unit in an atmospheric pressure state to the third unit in a reduced pressure state.

On the other hand, if the volume of the first unit is smaller than ¹⁄₁₀ of that of the third unit, the size of substrates which can be treated with the present apparatus may be excessively restricted.

② Arrangement

Figure 2:
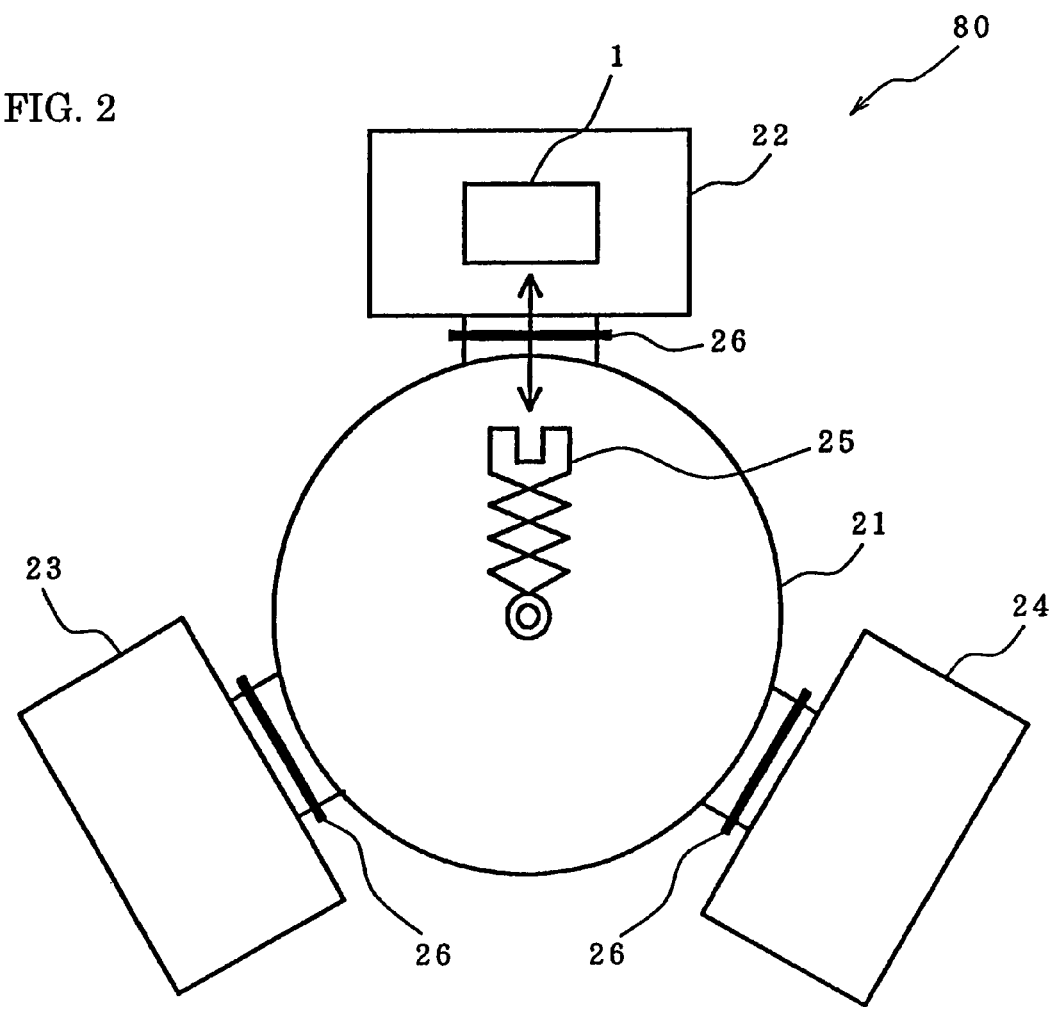
FIG. 2 is a view illustrating an apparatus for producing an organic EL display device (No. 2)
Figure 3:
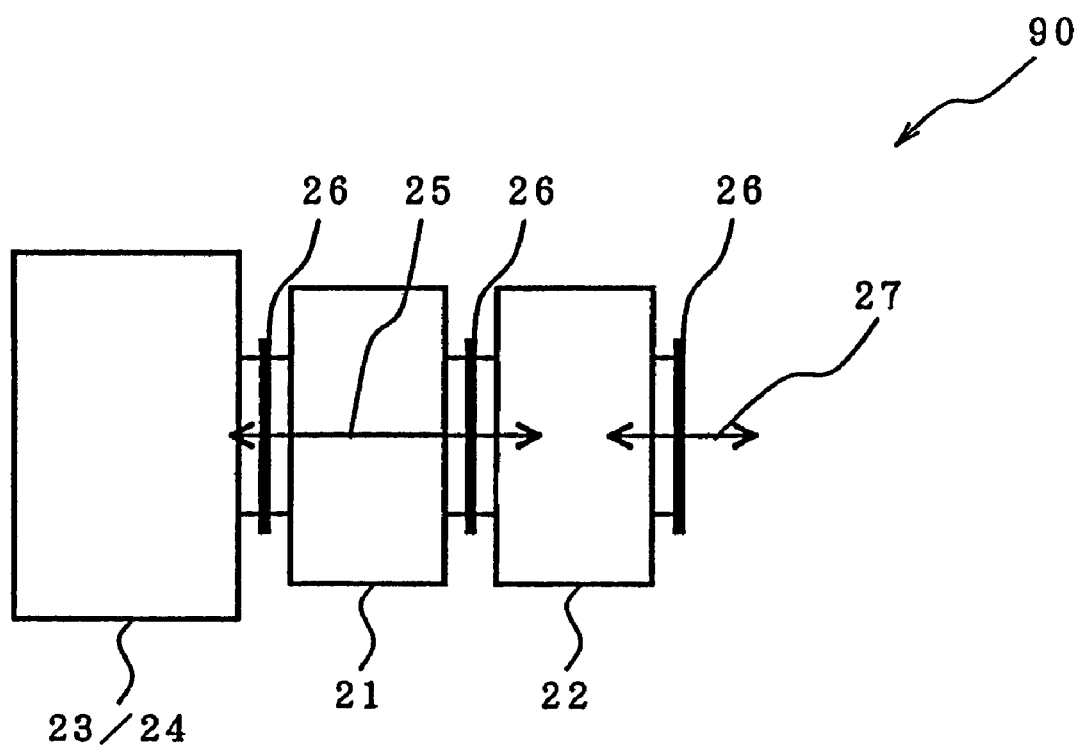
FIG. 3 is a view illustrating an apparatus for producing an organic EL display device (No. 3)

As illustrated in FIGS. 1 to 3, the first embodiment is characterized in that the first unit 21 is arranged between the second unit 23 and the third unit 22.

A first reason why such arrangement is carried out is that the arrangement makes it possible to come and go to a substrate and so on between the second and third units 23 and 22 through the first unit 21. In other words, the first reason is that this arrangement makes it possible to perform dehydration treatment in the second unit 23 and film-deposition in the third unit 22 repeatedly through the first unit 21.

For example, a substrate on which a lower electrode is set is subjected to a given dehydration treatment in the second unit 23, and subsequently the resultant is transferred from the second unit 23 to the third unit 22 through the first unit 21 to form a hole injection layer. Next, the substrate on which the hole injection layer is formed is again transferred from the third unit 22 to the second unit 23 from the first unit 21 and then subjected to a given dehydration treatment. Thus, the water content in the hole injection layer is made to a given value or less. By repeating such a manner, the formation and dehydration of an organic luminescence layer, the formation and dehydration of an electron injection layer, the formation and dehydration of an upper electrode, and so on are performed so that the water content can be adjusted into a very low value before sealing.

A second reason why the above-mentioned arrangement is performed is that this arrangement makes it possible to perform dehydration treatment and film-deposition simultaneously or successively on plural substrates through the first unit 21.

For example, the first and second carrying devices 25 and 27 are set up in the first unit 21, and further a first substrate and a second substrate to be treated are put on the respective carrying devices. Next, only the first substrate is transferred to the second unit 23 by the first carrying device 25, to conduct a given dehydration treatment. The first substrate subjected to the dehydration treatment is transferred from the second unit 23 to the third unit 22 through the first unit 21 by the first carrying device 25. At the same time, the second substrate put on the second carrying device 27 is transferred from the first unit 21 to the second unit 23. In the third unit 22, film-deposition is performed on the first substrate at the same time when the second substrate can be subjected to a dehydration treatment in the second unit 23.

A third reason why such arrangement is performed is that the arrangement makes it possible to reduce the number of carrying devices. In other words, if the number of the carrying device(s) 25 set in the first unit 21 is at least one, the carrying device 25 is used to make it possible to transfer a substrate and so on between the second unit 23 and the third unit 22.

Thus, such arrangement of the 1st to 3rd units 21, 23 and 22 permits the producing apparatus to be small-sized.

A fourth reason why such arrangement is performed is that the arrangement makes it possible to produce a state that the second unit 23 and the third unit 22 do not interfere with each other.

In other words, if the second unit 23 and the third unit 22 are directly connected to each other, it is feared that moisture and low molecular weight substances to be discharged outside by the second unit 23 invade the inside of the third unit 22 or heat to be radiated outside is conducted into the third unit 22.

Thus, such problems can be solved by arranging the first unit 21 between the second unit 23 and the third unit 22.

③ Carrying Device

One example of the carrying device is illustrated in FIG. 2, and the moving directions thereof are illustrated by arrows in FIGS. 1 to 3. This device 25 is preferably a device which is capable of fixing (gripping) a substrate and moving the position thereof. Therefore, examples thereof include a movable arm having a gripping portion and an expansion and contraction portion, a robot arm, a movable rail, and a rotating plate.

The number of the carrying machines 25 and 27 is not limited. The number is preferably a value within the range of 1 to 5, and is more preferably a value within the range of 1 to 3. This is because as the number of the carrying devices is larger, the number of substrates which can be treated can be made larger but the producing apparatus may be large-sized or the size of the substrates which can be treated may be limited.

Dependently on the structure of the producing apparatus, the first carrying device 25 and the second carrying device 27 are preferably made common in light of the space thereof in the case that the first unit 21 is directly connected to the fourth unit 24 as illustrated in FIG. 2 or in the case that the second unit 23 and the fourth unit 24 are common as illustrated in FIG. 3. Such a structure makes it possible to make the producing apparatus more small-sized and make the operation of the carrying device simple.

2. Second Unit

The second unit 23 illustrated in FIGS. 1 to 3 is a dehydrating unit (dehydrator) for dehydrating a substrate, an organic luminescence medium, and so on.

Figure 11:
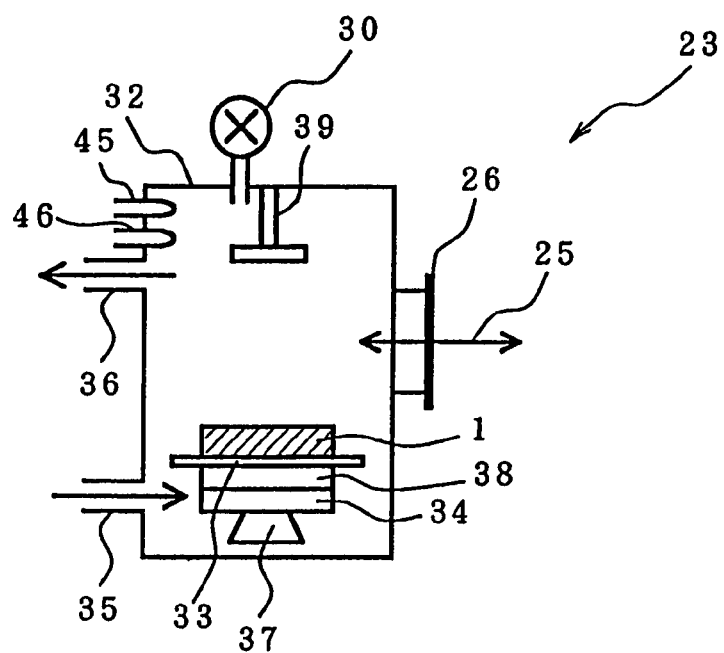
FIG. 11 is a schematic view of a second unit.

As is separately illustrated in FIG. 11, the second unit preferably comprises a housing 32, a substrate stage 33, a cooling device 38, a hot plate 34, a supporting base 37, dry gas circulating devices 35 and 36, a vacuum pump 30, a dew point hydrometer 45, a full automatic moisture absorption/desorption measuring device 46, and a plasma cleaning device 39.

The housing 32 among these constituent members is a member for receiving at least the supporting substrate 1 and so on to be dehydrated, the substrate stage 37, and the dehydrator.

The hot plate 34 and the cooling device 38 are arranged below the substrate stage 33, and constitute a dehydrator wherein the temperature of the supporting substrate 1 and so on is adjusted (heated or cooled) so that the dew point is adjusted and water is removed. An infrared ray lamp is preferably set up instead of the hot plate 34 or together with the hot plate 34 since heating can be attained for a short time.

The dry gas circulating devices 35 and 36 are set to remove water by introduction of an inert gas with adjustment of the dew point with the dew point hydrometer 45. Therefore, the substrate and so on are not exposed to the atmosphere in the dehydration step.

The dew point hydrometer 45 and the full automatic moisture absorption/desorption measuring device 46 are set up to measure the water content in the luminescence medium.

Furthermore, the plasma cleaning device 39 is set to remove impurities adhering to the surface of the substrate or dust and obtain a stable organic EL luminescence.

Accordingly, the following is preferred: an inert gas is blown against the supporting substrate and so on, fixed on the substrate stage inside the housing, under a flow rate of, for example, 10 liters/minute, using the dry gas circulating device, and a dehydration treatment is conducted for a given time while confirming that the dew point is −10° C. or lower with the dew point hydrometer.

A dehydration treatment is preferably conducted for 1 to 120 minutes as follows: at the same or different time of the introduction of the inert gas, the heating device or the cooling device, such as the plate set up below the substrate stage, is used to control the temperature of the supporting substrate into a given temperature, preferably a value within the range of 40 to 300° C., more preferably a value within the range of 50 to 200° C., and still more preferably a value within the range of 80 to 150° C. Particularly in the case that an organic film such as an interlayer dielectric is beforehand formed on the substrate, the supporting substrate is preferably heated in the range of 40 to 80° C. to prevent heat deterioration of the organic film.

At the same or different time of the introduction of the inert gas, the vacuum pump is used to adjust the degree of vacuum of the inside of the housing, preferably into 13.3 Pa (0.1 Torr) or less, and more preferably into 0.00133 Pa (0.00001 Torr) or less.

In the case that at the time of performing plasma cleaning, argon and oxygen are used as the plasma gas, the flow rates thereof are preferably set to 20 to 1000 sccm and 10 to 500 sccm, respectively, and the pressure thereof is preferably set to 0.1 to 10 Pa. It is also preferred to set the frequency of the high frequency wave (RF) at the time of the plasma cleaning to 13.56 MHz, set the output thereof to a value within the range of 10 to 200 W, and set cleaning time to a value within the range of 1 to 60 minutes.

The full automatic moisture absorption/desorption measuring device set in the dehydration unit is used to make it possible to measure the water content in the organic luminescence medium. Specifically, when the water content in the organic luminescence medium is measured, a part of the organic luminescence medium is collected from the supporting substrate and then the above-mentioned weights A and B are measured so that the water content can be calculated. The organic luminescence medium can be collected manually, or automatically using the carrying device.

Figure 18:
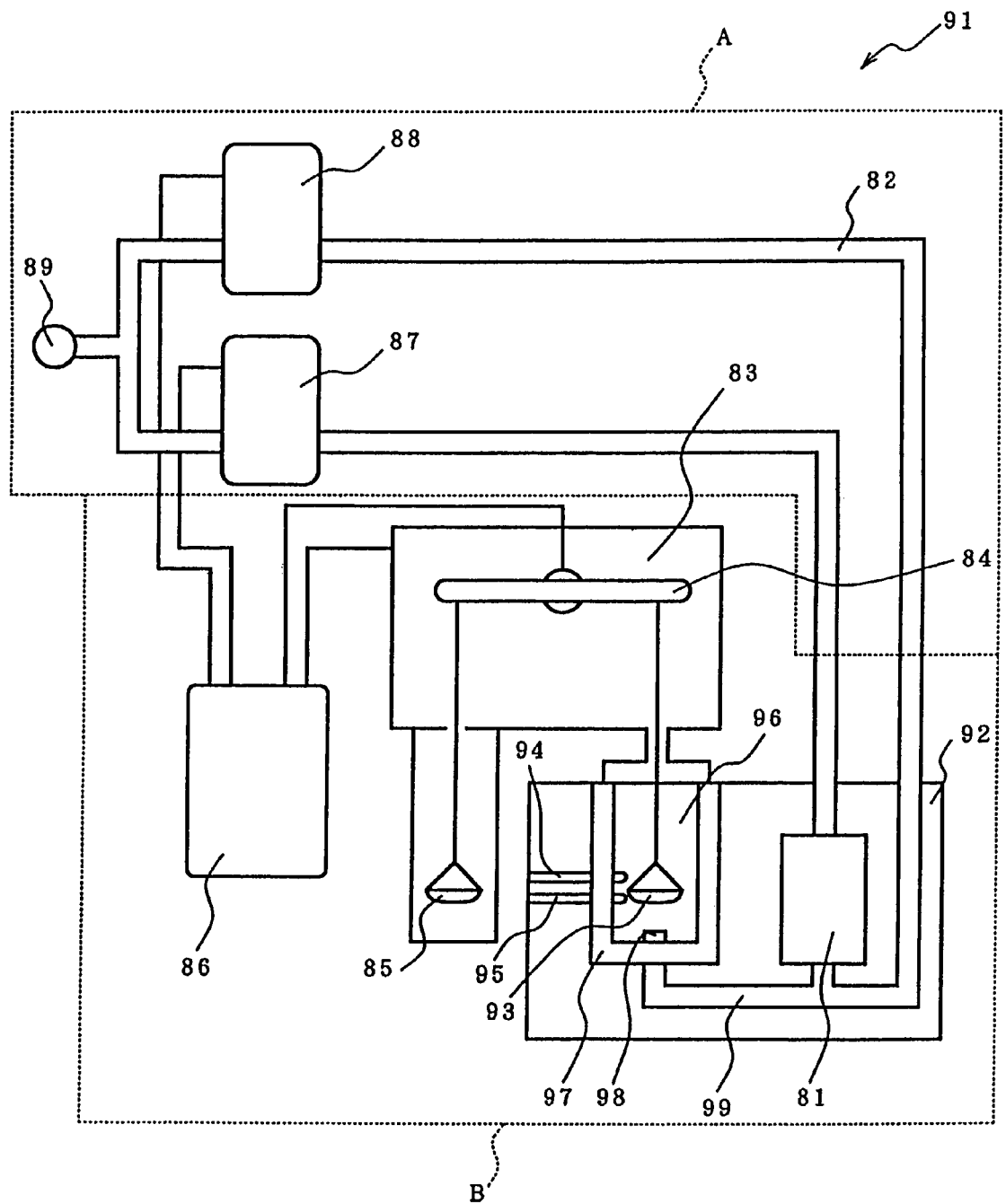
FIG. 18 is a view for explaining a full automatic moisture absorption/desorption measuring device.
Figure 19:
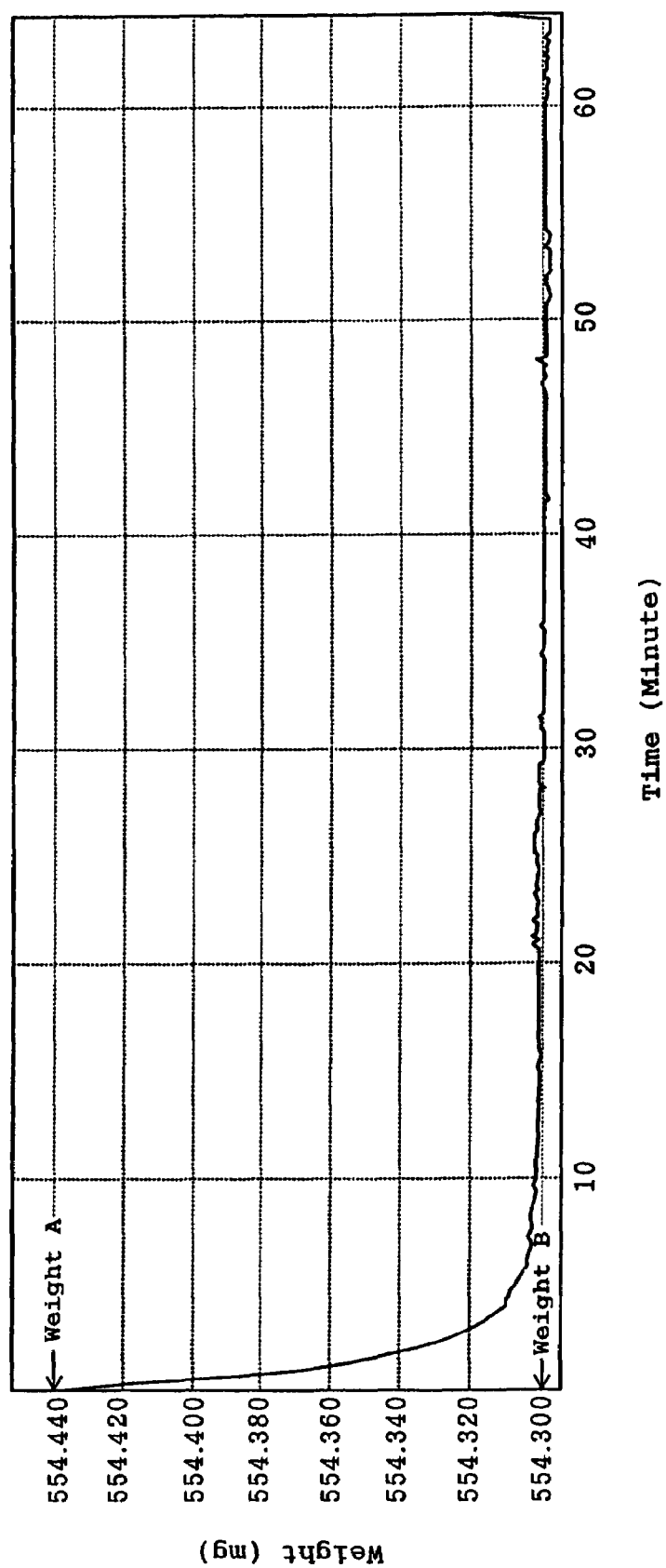
FIG. 19 is a moisture measuring chart resulting from measurement with the full automatic moisture absorption/desorption measuring device as shown in FIG. 18.
Figure 20:
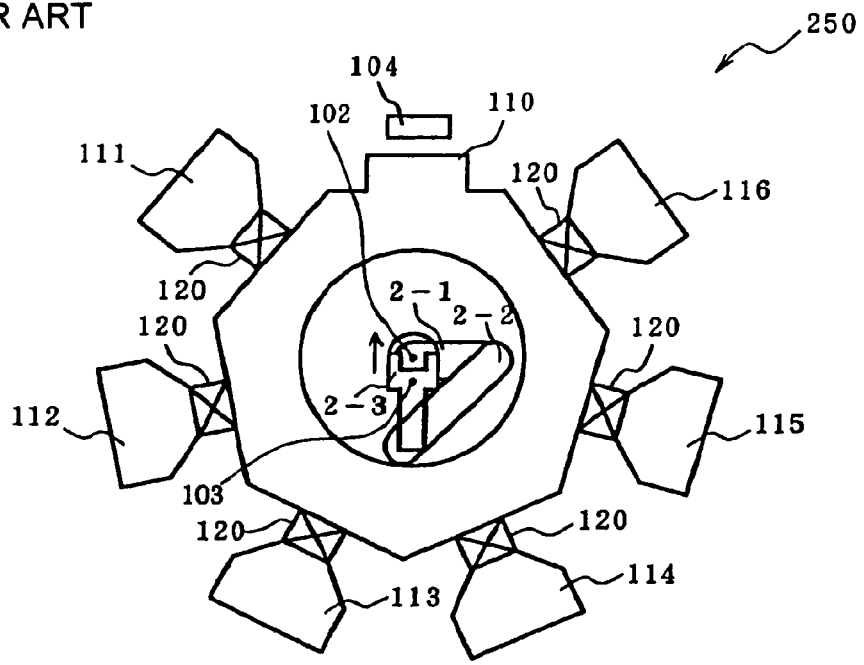
FIG. 20 is a view illustrating a conventional apparatus for producing an organic EL display device (No. 1)
Figure 21:
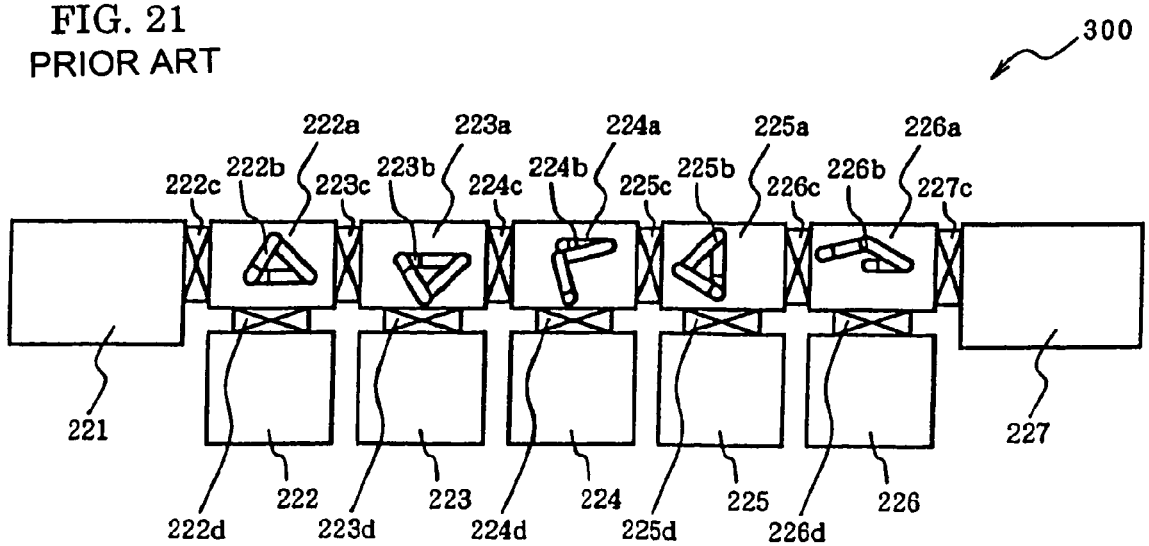
FIG. 21 is a view illustrating a conventional apparatus for producing an organic EL display device (No. 2)
Figure 22:
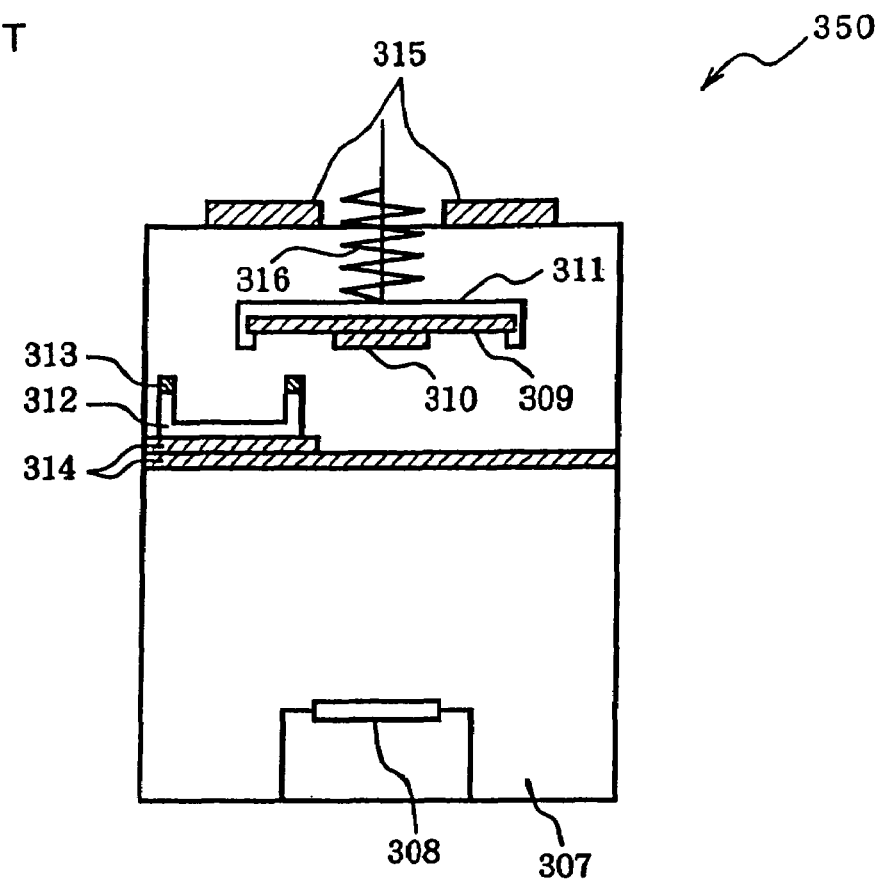
FIG. 22 is a view illustrating a conventional apparatus for producing an organic EL display device (No. 3)
Figure 23:
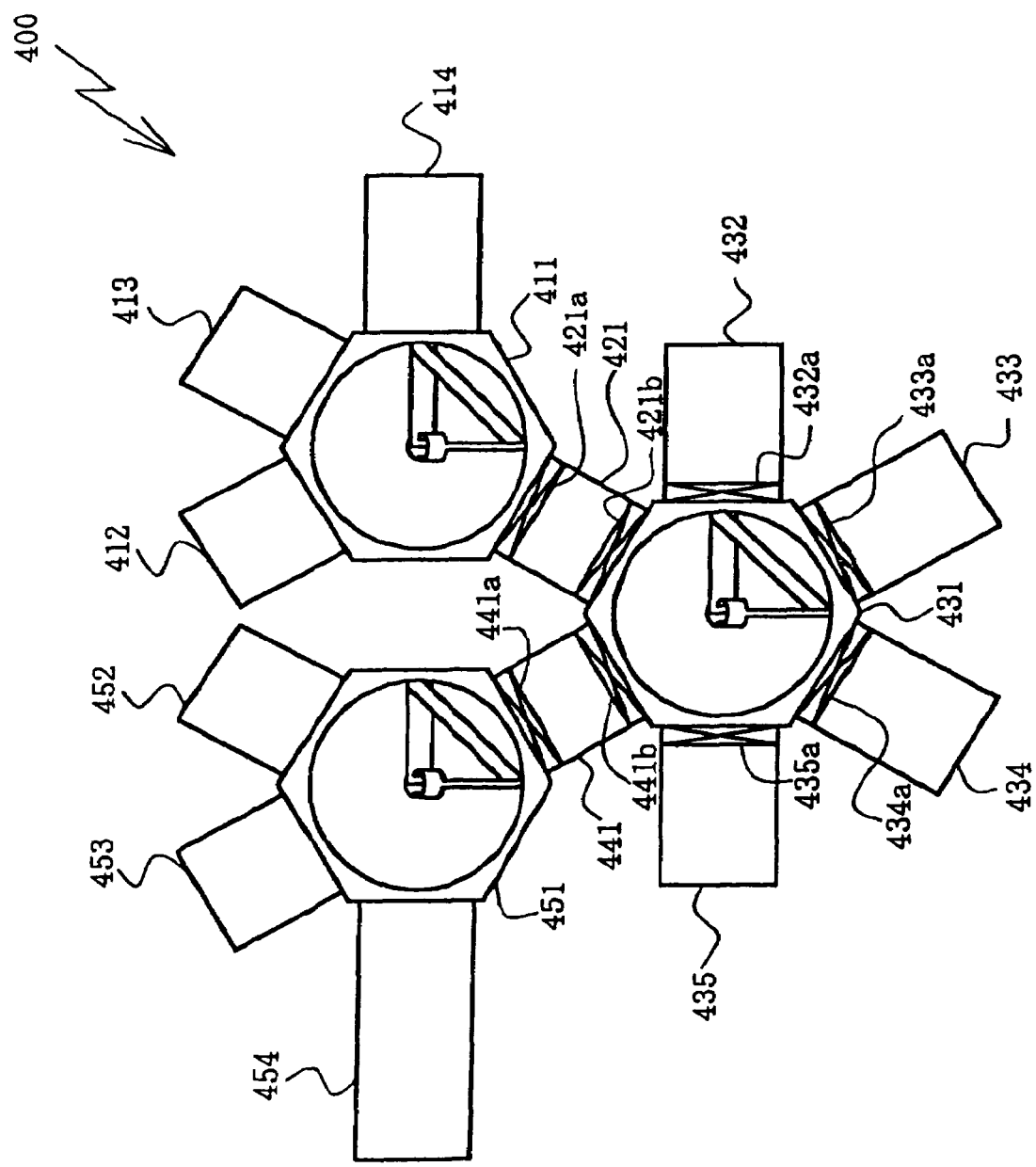
FIG. 23 is a view illustrating a conventional apparatus for producing an organic EL display device (No. 4).

Referring FIGS. 18 and 19, the following will describe the outline of the full automatic moisture absorption/desorption measuring device.

The full automatic moisture absorption/desorption measuring device 51 illustrated in FIG. 18, which is one example of such devices, is composed of a circulating section A and a moisture measuring section B. They are divided in the drawing by a dot line.

The circulating section A is composed of a gas storing unit 68; a dry gas circulating device 67 and a wet gas circulating device 66, which are connected to forked portions of the gas storing unit 68; and a circulating path 61 for connecting these circulating devices 66 and 67 to the moisture measuring section B. The circulating devices 66 and 67 are operated by remote control from a control room 65 inside the moisture measuring section B.

On the other hand, the moisture measuring section B is composed of the control room 65, a balance room 62, a comparative sample room 64 (including a comparative sample plate), a dry box 65, an oil bath 52, and so on. A heating device 57 is arranged around the dry box 56. A temperature sensor 54 for monitoring the temperature inside the dry box 56 and a humidity sensor 55 for monitoring the humidity are set in the dry body 56 and near the balance 53 on which a measurement sample is put.

According to the full automatic moisture absorption/desorption measuring device 51, after the temperature and the humidity can be made constant by passing a dry gas supplied from the circulating section A through the oil bath 52, this dry gas can be introduced into the dry box 56 through an inlet 58 and the temperature and the humidity inside the dry box 56 can be kept constant by the heating device 57. A precision balance 63 is used in this state to measure the weight of the measurement sample, such as a glass substrate which is put on the balance 53, in the control room 65, with comparison with the comparative sample (reference) in the comparative sample room 64.

FIG. 19 shows a measurement chart obtained by measuring the weight. The transverse axis thereof represents passage time (minute), and the vertical axis represents the weight (g) of the sample. According to the measurement of this sample, the weight A was 554.440 mg, and the weight B was 554.300 mg. In this example, the humidity inside the dry box 56 was controlled into 0%.

The weights A and B are preferably measured using the precision balance set in the full automatic moisture absorption/desorption measuring device. The water content can also be measured by the method according to ASTM D570-63, thermal analysis (differential thermal analysis: DTA, or differential scanning calorimetry: DSC), or Karl Fischer technique.

3. Third Unit

The third unit 22 is a film-depositing unit for depositing the organic luminescence medium, the upper electrode, or the like on the surface of the supporting substrate or the like.

Figure 14:
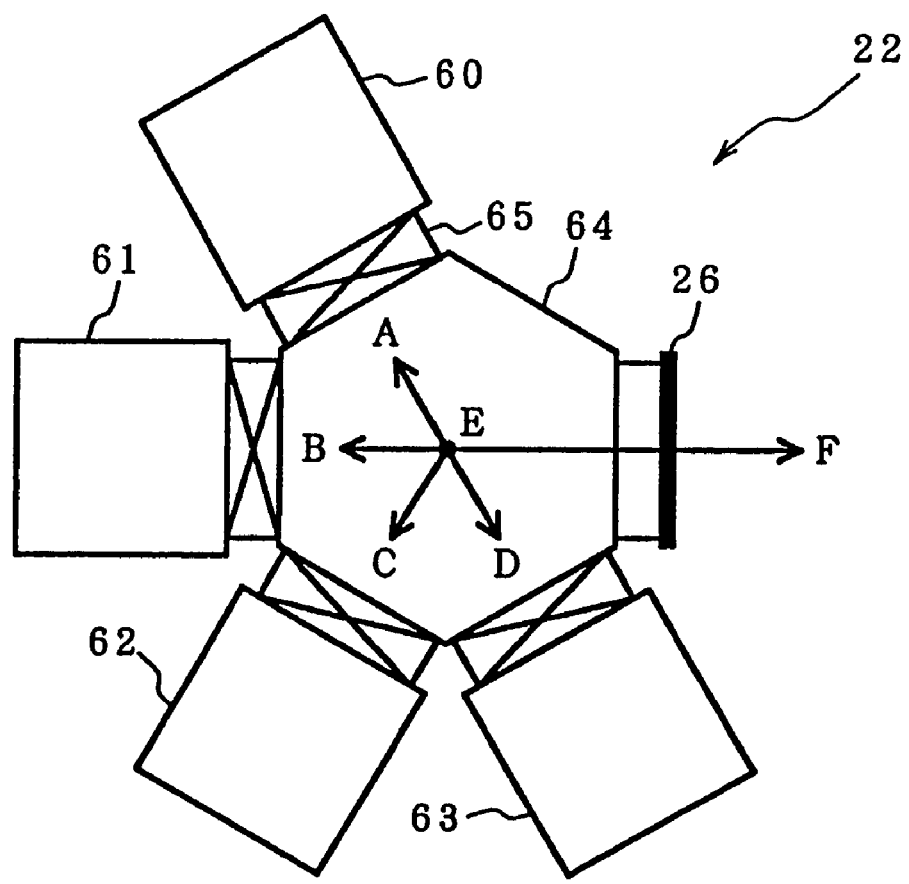
FIG. 14 is a schematic view of a third unit (No. 3)

As is separately illustrated in FIG. 14, therefore, the third unit 22 preferably comprises at least one vapor depositing device 60 and 61, a sputtering device 62, an ion plating device, an electron beam evaporation device, a chemical vapor deposition (CVD) device, a metal oxide chemical vapor deposition (MCVD) device, a plasma enhanced chemical vapor deposition, or the like.

① Vapor Deposition Device Capable of Simultaneous Vapor Deposition

The third unit 22 is preferably a vapor deposition device capable of subjecting plural samples simultaneously or successively to vapor deposition.

Figure 12:
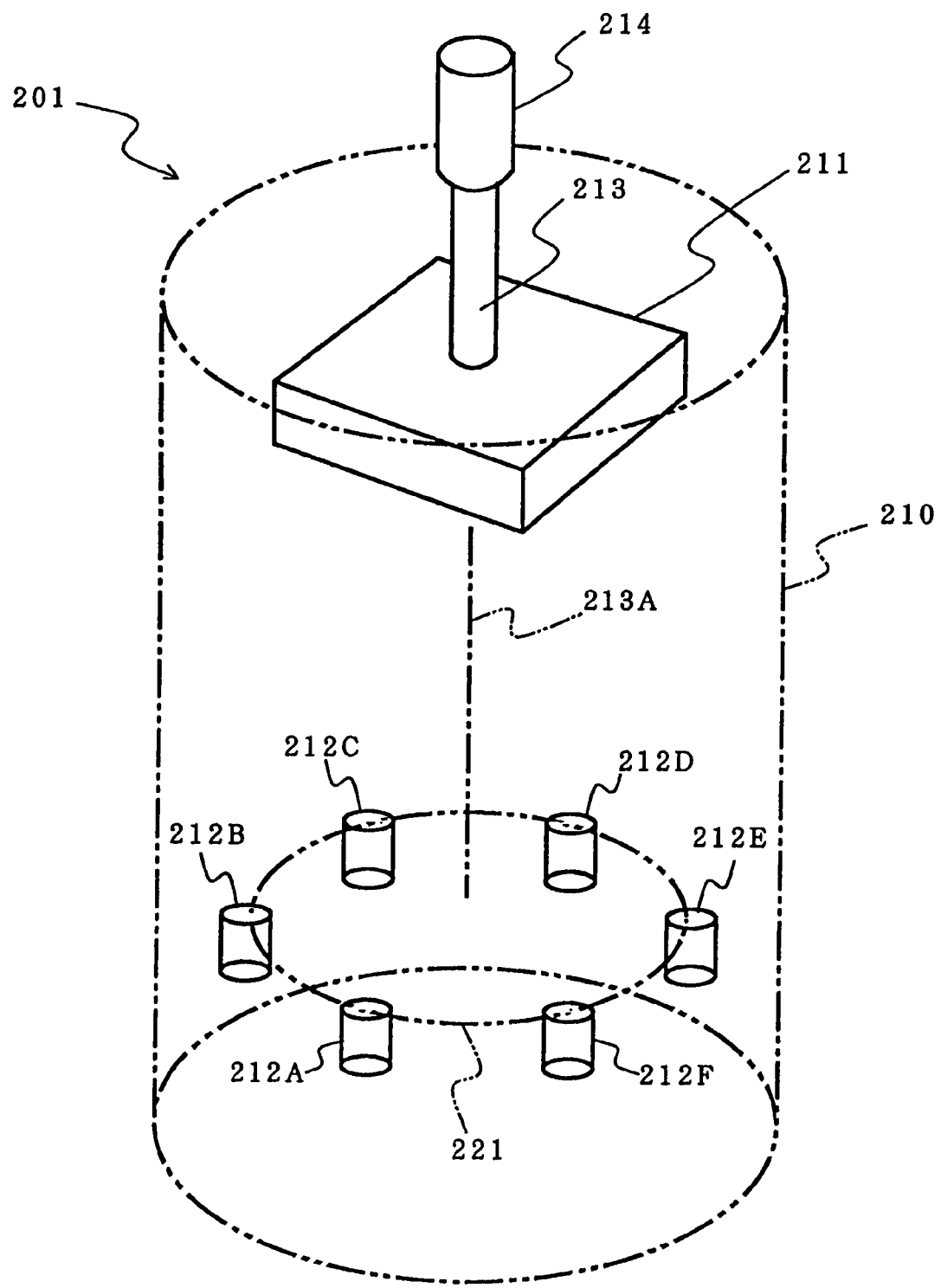
FIG. 12 is a schematic view of a third unit (No. 1)
Figure 13:
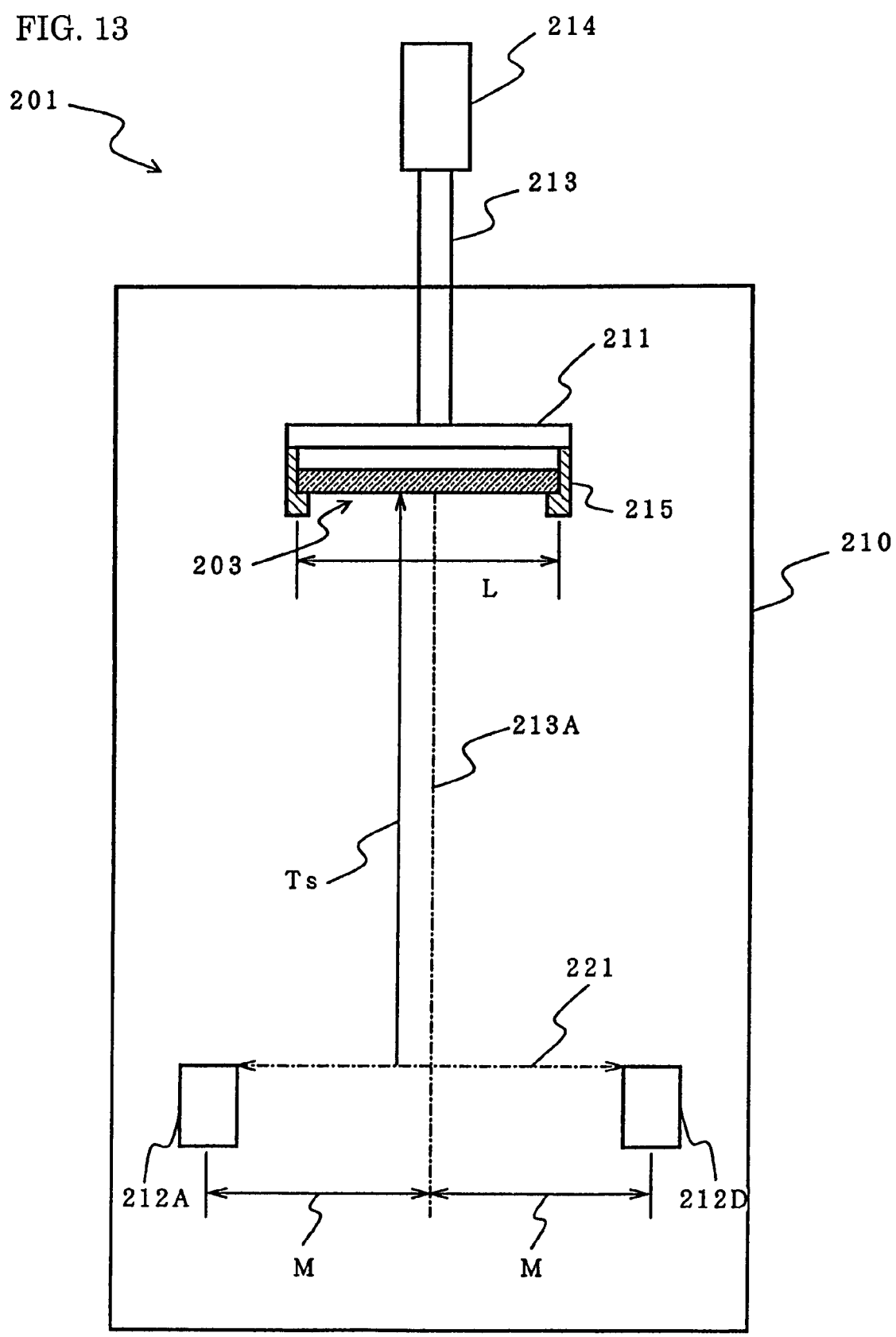
FIG. 13 is a schematic view of the third unit (No. 2)

Specifically, it is preferred that a vacuum deposition device 201 as illustrated in FIGS. 12 and 13 is used to evaporate plural evaporation materials (plural samples) simultaneously or successively from plural evaporation sources 212A to 212F arranged oppositely to a substrate 203.

It is also preferred that using this vacuum evaporation device 201, a rotation axis 213A for rotating the substrate 203 on its axis is set to the substrate 203 and the evaporation sources 212A to 212F are arranged apart from the rotation axis 213A for the substrate 203 to perform vapor deposition while the substrate 203 is rotated on its center.

The following will describe the vacuum evaporation device 201 illustrated in FIGS. 12 and 13 in more detail. The device 201 is composed of a vacuum tank 210, a substrate holder 211 for fixing the substrate 203, arranged at the upper side inside the vacuum tank 210, and plural (six) evaporation sources 212A to 212F in which evaporation materials are charged, arranged below the substrate holder 211 and oppositely to the holder 211.

In this vacuum tank 210, its inside can be kept in a reduced pressured state by an exhausting means (not illustrated). The number of the evaporation sources, which is six on the drawing, is not limited to six, and may be 5 or less, or 7 or more.

The substrate holder 211 has a holder unit 215 for supporting the periphery of the substrate 203, and is made to hold the substrate 203 horizontally inside the vacuum tank 210.

A rotation axis unit 213 for rotating the substrate 203 (on its axis) is vertically arranged at the center of the upper face of the substrate holder 211. A motor 214, which is a rotation driving means, is connected to the rotation axis unit 213. By rotation operation of the motor 214, the substrate 203 held on the substrate holder 211 together with the substrate holder 211 rotate around the rotation axis unit 213.

In short, the rotation axis 213A of the rotation axis unit 213 is vertically set at the center of the substrate 203.

In this vapor deposition device, the shape of the substrate 203 is not particularly limited. In the case that the substrate 203 is, for example, in a rectangular and plate form as illustrated in FIGS. 12 and 13, it is desired to satisfy $M>(½) \times L$ when the plural evaporation sources 212A to 212F are arranged on the circumference of an imaginary circle 221, the center of which is present at the rotation axis 213A of the substrate 203, the radius of the imaginary circle 221 is represented by M, and the length of one side of the substrate 203 is represented by L. When the lengths of the sides of the substrate 203 are different, the longest length thereof is represented by L.

Such a structure makes it possible to make the incident angles of the evaporation materials, from the evaporation sources 212A to 212F, to the substrate 203 identical to each other. Therefore, the composition ratio of the evaporation materials can easily be controlled.

Such a structure makes it possible that the evaporation materials are evaporated with a constant incident angle to the substrate 203. Therefore, the evaporation materials are not subjected to perpendicular incidence, and the uniformity of the composition ratio in the film surface can be still more improved.

It is desired to arrange, in this vapor deposition device, the respective evaporation sources 212A to 212F at intervals of an angle of 360°/n around the center of the imaginary circuit 221 when the plural evaporation sources 212A to 212F are arranged on the circumference of the imaginary circle 221, the center of which is present at the rotation axis 213A of the substrate 203, as illustrated in FIG. 12, and the number of the arranged evaporation sources 212A to 212F is represented by n.

In the case that the number of the arranged evaporation sources 212 is, for example, six, it is preferred that they are arranged at intervals of an angle of 60° around the center of the imaginary circle 221.

Such arrangement makes it possible to form films successively from the plural evaporation materials on respective portions of the substrate 203 in the manner that the films overlap with each other. It is therefore possible to deposit thin layers whose composition ratio is regularly changed in the thickness direction of the layers.

② Device wherein both a Vapor Deposition Device and a Sputtering Device are used As illustrated in FIG. 14, the third unit is preferably a device 22 wherein both of the vapor deposition devices 60 and 61 and the sputtering device 62 are used.

Such arrangement makes it possible to select appropriately the film-deposition methods for the respective layers of the organic EL element, correspondingly to the kinds of use materials. For example, about an organic material, a film therefrom is preferably deposited using the vapor deposition device 60 and 61. About an inorganic material, a film therefrom is preferably deposited using the sputtering device 62.

In the case that the third unit is preferably a device 22 wherein both of the vapor deposition devices 60 and 61 and the sputtering device 62 are used, it is preferred that a buffer room 64 is disposed and further the vapor deposition devices 60 and 61, the sputtering device 62, or a plasma cleaning device 63 are connected to each other through the buffer room 64 by means of connecting members 65, as illustrated in FIG. 14. Setting of the buffer room 64 in this way makes it possible to prevent the vacuum degree in the respective vapor deposition devices from being lowered by adjusting the vacuum degree in the buffer room 64 even if the substrate is carried into the respective vapor deposition devices or the like.

Setting of the buffer room 64 in this way also makes it possible to perform film-deposition, correspondingly to a desired organic EL display device. Specifically, for one substrate, successive treatments can be conducted in the plasma cleaning device 63, the vapor deposition devices 60 and 61, and the sputtering device 62. For another substrate, a treatment can be conducted in any one of the plasma cleaning device 63, the vapor deposition devices 60, and the sputtering device 62.

In FIG. 14, arrows A to D and F from the central position E of the buffer room 64 represent respective advancing directions of the substrate. In the case that a carrying device (not illustrated) and, for example, the vapor deposition devices 60 and 61 are used, it is advisable to transfer the substrate in the direction of the arrow A or B.

③ Plasma Cleaning Device

As illustrated in FIG. 14, the third unit is preferably provided with the plasma cleaning device 63.

Use of this plasma cleaning device 63 makes it possible to clean the surface of the dehydrated substrate and so on more effectively in the second unit 23. Therefore, an organic EL display device superior in precision and endurance can be produced.

Conditions for plasma-cleaning in the plasma cleaning device 63 are not particularly limited. In the case that, for example, argon and oxygen are used as the plasma gas, the flow rates thereof are preferably set to 20 to 1000 sccm and 10 to 500 sccm, respectively, and the pressure thereof is preferably set to 0.1-10 Pa. In the case that the frequency of the high frequency wave (RF) is set to 13.56 MHz at the time of the plasma cleaning, it is preferred to set the output thereof to a value within the range of 10 to 200 W. Under such plasma cleaning conditions, it is preferred to set cleaning time to a value within the range of 1 to 60 minutes.

This is because pollutants, such as organic substances, adhering to the surface of transparent electrodes made of ITO or the like can be effectively removed without the surface being excessively damaged if the above-mentioned plasma cleaning conditions are used. If the above-mentioned plasma cleaning conditions are used, the surface of the transparent electrodes can be reformed into an optimal state so that hole injection ability can be improved.

When the plasma cleaning device 63 is used, the substrate is preferably cleaned before film-deposition by the plasma cleaning device 63. It is also preferred that plasma treatment is conducted in the same device after film-deposition in order to remove low molecular weight substances and so on.

④ Precision Balance

In order to set the water content (W) in the organic luminescence medium after it is deposited to 0.05% or less by weight for reasons that will be described later, it is preferred to set up a precision balance, for example, a full automatic absorption/desorption measuring device having a precision balance.

However, there is a case in which organic films such as an interlayer dielectric, a flattening layer, a fluorescence medium and a color filter are present around the organic luminescence medium so that it is difficult to distinguish the organic luminescence medium from the other organic films. In this case, the weight of the mixture which partially contains the organic films other than the organic luminescence medium is measured, and then the water content in the organic luminescence medium may be calculated from a value obtained from the weight. This is because it has been separately proved that by setting the water content in such a mixture to 0.05% or less by weight, a drop in the luminescence area ratio can be effectively prevented. Specifically, it can be considered that moisture by which the thus measured water content is defined diffuses without being located in the organic films other than the organic luminescence medium, for example, the interlayer dielectric, and then invades the organic luminescence medium so that an equilibrium state is caused and the water causes the organic luminescence medium or the opposite electrode to be oxidized or deteriorated. It can be therefore considered that even if a mixture composed of, for example, the organic luminescence medium, the interlayer dielectric and so on is collected, the water content in the organic luminescence medium is 0.05% or less by weight.

Thus, in the case that, for example, the interlayer dielectric is deposited around the organic luminescence medium, it is advisable to collect arbitrarily the organic luminescence medium and the interlayer dielectric as a mixture, measure the weights A and B about the mixture, and set the water content calculated from these weights to 0.05% or less by weight.

However, dependently on the structure of the organic EL display device, the water content in the organic luminescence medium or the water content in the organic films comprising the organic luminescence medium can be roughly grasped without collecting the organic luminescence medium.

Specifically, the weight C of the organic luminescence medium having the supporting substrate and so on before drying, and the weight D thereof after the drying are measured using the full automatic desorption/desorption measuring device, and further the weight E of the supporting substrate and so on other than the organic luminescence medium or the weight E of the supporting substrate and so on other than the organic film comprising the organic luminescence medium, the weight E being beforehand measured using the full automatic desorption/desorption measuring device, is obtained to estimate the water content (W) in the organic luminescence medium or the organic films comprising the organic luminescence medium from the following equation:

$$W=[(\text{weight}C-\text{weight}D)/(\text{weight}D-\text{weight}E)]\times 100$$

4. Fourth Unit

The fourth unit 24 is a sealing unit (sealing device) for covering the periphery of the organic EL element obtained at the time of the finishing of the third unit 22 with a sealing member in order to prevent moisture from invading the inside of the organic EL element.

Figure 15:
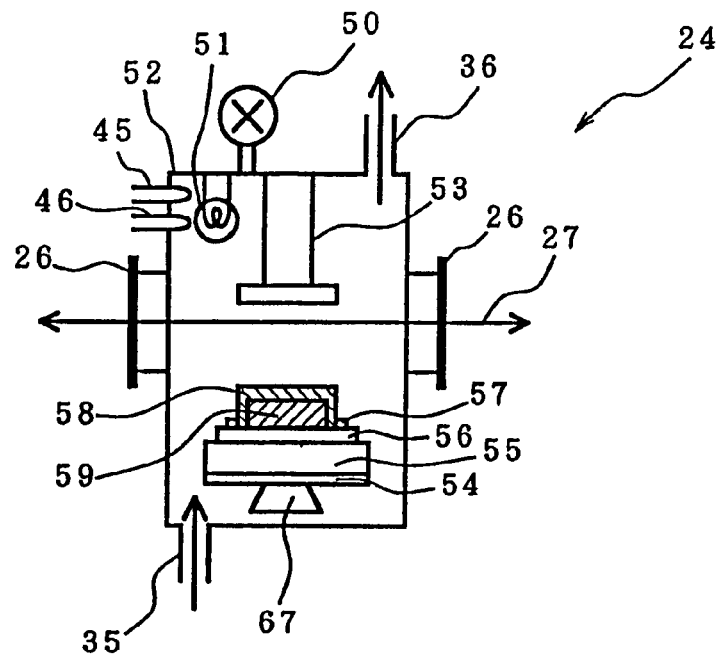
FIG. 15 is a schematic view of a fourth unit.

As is separately illustrated in, for example, FIG. 15, the fourth unit 24 preferably comprises a housing 52, a substrate stage 55, a hot plate 54, a pressing device 53, an exposure equipment 51 for setting an adhesive, dry gas circulating devices 35 and 36, a vacuum pump 50, a dew point hydrometer 45, and a full automatic desorption/desorption measuring device 46.

In other words, it is preferred to circulate a dry gas such as nitrogen or argon sufficiently inside the housing 52, using the dry gas circulating devices 35 and 36, cover the periphery of an organic element 59 with a sealing member 58 in this state, and seal the periphery thereof with an adhesive 57, for example, a radical setting adhesive, a cation setting adhesive, a thermosetting adhesive, or a moisture setting adhesive.

In order not to cause positional slippage when the adhesive 57 is set, it is also preferred to apply pressure at a pressing power of $9.8 \times 10^4$ Pa to $4.9 \times 10^5$ Pa with the pressing member 53.

In order not to cause invasion of moisture from the interface between the adhesive 57 and the sealing member 58, it is also preferred to add, to the adhesive 57, 0.1 to 5% by weight of a silane coupling agent such as γ-aminopropyltrimethoxysilane or γ-glycydoxypropyltriethoxysilane.

In order to prevent invasion of moisture to the inside effectively, the constituent material of the sealing member 58 is preferably the same as that of the supporting substrate and is, for example, soda glass or quartz. The thickness of the sealing member 58 is preferably a value within the range of 0.1 to 1 mm.

In order to make the creeping distance from the outside to the organic EL element 59 long, it is preferred to make a groove (not illustrated) in the substrate, fill the adhesive 57 thereinto, and press and fix the sealing member 58 thereto.

5. Connecting Unit

It is preferred that connecting parts 26 are arranged between the first and second units, between the first and third units and between the second and third units, and are composed of gate valves, shutter mechanism (partitions) or the like.

These connecting parts 26 are preferably in synchronization with the first and second carrying device (not illustrated).

For example, in the case that the substrate is transferred from the first unit in an atmospheric pressure state to the second unit in an atmospheric pressure state, the first carrying device grasps the substrate and advances toward the second unit. In synchronization with it, the connecting part between the first and second units is opened. It is therefore possible that the first carrying device passes through the connecting part to reach the second unit and subsequently the device stops the grasping of the substrate to put the substrate on a given position in the second unit.

In the case that the substrate is transferred from the first unit in an atmospheric pressure state to the second unit in a low pressure state, the connecting part between the first unit in the atmospheric pressure state and the second unit in the low pressure state is first opened and further the first carrying device advances from the first unit to the second unit to grasp the substrate.

Next, the first carrying unit advances from the first unit to the second unit in the state that the carrying unit grasps the substrate, and then the carrying unit stops in the second unit. Next, the connecting part between the first and second units is closed and further the vacuum pump of the first unit is operated. When the vacuum degree of the first unit is equal to that of the third unit, the connection unit between the first and third units is opened and further the first carrying unit advances again from the first unit in the low pressure state to the third unit in the low pressure state in the state that the first carrying device grasps the substrate. Thus, the first carrying device reaches the third unit and then stops the grasping of the substrate. Thus, the substrate can be put on a given position in the third unit.

6. Organic EL Display Device

The organic EL display device obtained with the producing apparatus of the first embodiment preferably has the following structure.

(1) Supporting Substrate

The supporting substrate (which may be referred to the substrate hereinafter) in the organic EL display device is a member for supporting the organic EL element, TFT and so on. It is therefore preferred that the substrate is superior in mechanical strength and dimensional stability.

Specific examples of such a substrate include glass substrates, metal plates, ceramic plates, and plastic plates (such as polycarbonate resin, acrylic resin, vinyl chloride resin, polyethylene terephthalate resin, polyimide resin, polyester resin, epoxy resin, phenol resin, silicone resin and fluorine resin substrates).

In order to avoid the invasion of moisture into the organic EL display device, it is preferred that the substrate made of any one of the above is subjected to moisture-proof treatment or hydrophobic treatment by forming an inorganic film or applying a fluorine resin.

Particularly in order to avoid the invasion of moisture into the organic luminescence medium, it is preferred to make the water content in the supporting substrate and the gas transmission coefficient thereof small. Specifically, it is preferred to set the water content in the substrate and the gas transmission coefficient to 0.0001% or less by weight and $1 \times 10^{-13}$ cc·cm/cm²·sec. cmHg or less, respectively.

In the first embodiment, the substrate does not necessarily have transparency since EL luminescence is taken out from the side opposite to the substrate, that is, from the upper electrode side.

(2) Organic Luminescence Medium

The organic luminescence medium can be defined as a medium comprising an organic luminescence layer making EL luminescence possible by recombination of an electron and a hole. This organic luminescence medium can be made, for example, by depositing the following layers on the lower electrode.

① organic luminescence layer

② hole injection layer/organic luminescence layer

③ organic luminescence layer/electron injection layer

④ hole injection layer/organic luminescence layer/electron injection layer

⑤ organic semiconductor layer/organic luminescence layer

⑥ organic semiconductor layer/electron barrier layer/organic luminescence layer

⑦ hole injection layer/organic luminescence layer/adhesiveness improving layer

The structure ④ among these structures is usually preferred since it can give higher luminescence brightness and is superior in endurance.

① Constituent Material

The luminescence material in the organic luminescence medium may be one or a combination of two or more selected from the following: p-quaterphenyl derivatives, p-quinquephenyl derivatives, benzothiazol compounds, benzoimidazol compounds, benzoxazol compounds, metal-chelated oxinoide compounds, oxadiazol compounds, styrylbenzene compounds, distyrylpyrazine compounds, butadiene compounds, naphthalimide compounds, perylene derivatives, aldazine derivatives, pyrazirine derivatives, cyclopenetadiene derivatives, pyrrolopyrrole derivatives, styrylamine derivatives, coumarine compounds, aromatic dimethylidene compounds, metal complexes having an 8-quinolinol derivative as a ligand, and polyphenyl compounds.

② Water Content

In order to suppress the generation of dark spots effectively, the water content (W) in the organic luminescence medium defined by the following equation is set to preferably 0.05% or less by weight, more preferably 0.0001 to 0.04% by weight, still more preferably 0.0001 to 0.03% by weight, most preferably 0.0001 to 0.01% by weight.

$$W=[(\text{weight}A-\text{weight}B)/\text{weight}B]\times 100$$

weight A: the weight of the organic luminescence medium collected from the organic EL display device, the weight being measured with the full automatic moisture absorption/desorption measuring device (with the precision balance), and weight B: the weight of the organic luminescence heated at 75° C. in a dry box for 30 minutes, the weight being measured with the full automatic moisture absorption/desorption measuring device.

The weights A and B are preferably measured using the precision balance set in the full automatic moisture absorption/desorption measuring device. The water content can also be measured by the method according to ASTM D570-63, thermal analysis (differential thermal analysis: DTA, or differential scanning calorimetry: DSC), or Karl Fischer technique.

There is a case in which organic films such as an interlayer dielectric, flattening layer, a fluorescence medium and a color filter are present around the organic luminescence medium so that it is difficult to distinguish the organic luminescence medium from the other organic films. In this case, the weights A and B are measured as the mixture which partially contains the organic films other than the organic luminescence medium, and then a value obtained from the weights may be used as the water content. This is because it has been separately proved that by setting the water content in such a mixture to 0.05% or less by weight, a drop in the luminescence area ratio can be effectively prevented.

Thus, in the case that, for example, the interlayer dielectric is deposited around the organic luminescence medium, it is advisable to collect arbitrarily the organic luminescence medium and the interlayer dielectric as a mixture, measure the weights A and B about the mixture, and set the water content calculated from these weights to 0.05% or less by weight.

Figure 17:
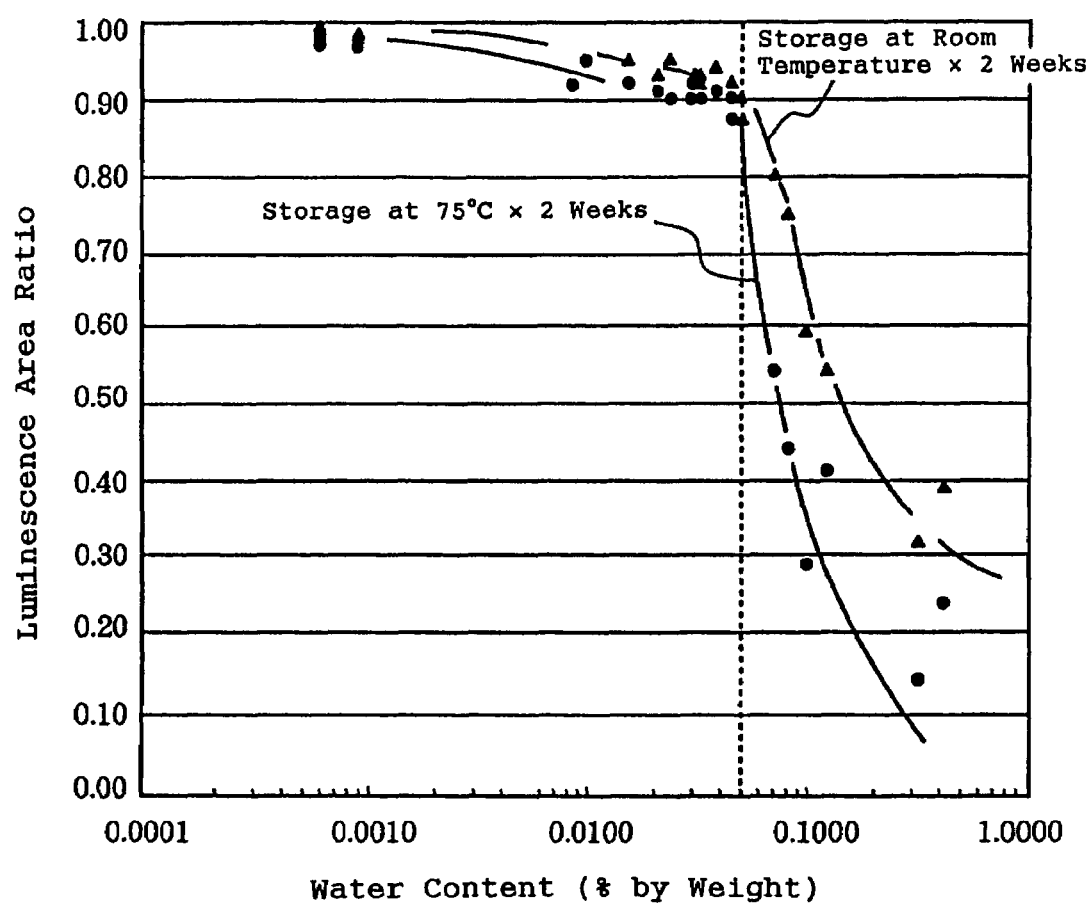
FIG. 17 is a graph showing a relationship between the water content in an organic luminescence medium and the ratio of a luminescence area.

Referring to FIG. 17, the following will specifically describe reasons why the water content in the organic luminescence medium is limited to a value of 0.05% or less by weight.

FIG. 17 shows relationship between the water content in the organic luminescence medium (which may partially include some other organic film) and the ratio of change in its luminescence area by the generation of dark spots. Its transverse axis represents the water content (% by weight) in the organic luminescence medium, and its vertical axis represents the ratio of change in the luminescence area (the area of the luminescence area after the generation of dark spots)/the area of the luminescence area before the generation of the dark spots) as a luminescence area ratio.

In FIG. 17, the symbol ▲ represents the luminescence area ratio in the case that the organic EL display device was allowed to stand at room temperature (25° C.) in the atmosphere for two weeks, and the symbol ● represents the luminescence area ratio in the case that the organic EL display device was allowed to stand in a thermostat of 75° C. for two weeks.

As is easily understood from FIG. 17, as the water content in the organic luminescence medium is smaller, the value of the luminescence area ratio trends to be larger. As the water content in the organic luminescence medium is larger, the value of the luminescence area ratio trends to be smaller. It is however observed that the luminescence area ratio does not change linearly to the water content in the organic luminescence medium and if the water content is over 0.05% by weight, the luminescence area ratio is markedly low.

Therefore, by limiting the water content in the organic luminescence medium to not more than a value of 0.05% by weight, which has such a critical significance, a drop in the luminescence area ratio can be effectively prevented. In other words, the generation of dark spots can be suppressed so that a high luminescence brightness can be obtained for a long time.

The luminescence area ratio trends to be smaller in the storage in the thermostat of 75° C. for two weeks than in the storage in the atmosphere at room temperature (25° C.) if the water contents under the two conditions are the same. In the two standing conditions, however, a phenomenon that the luminescence area ratio is markedly low if the water content is over 0.05% can be observed.

Conversely speaking, by limiting the water content in the organic luminescence medium to 0.05% or less by weight, the generation of dark spots can be markedly suppressed not only under the standing condition in the atmosphere at room temperature (25° C.) for two weeks but also under the standing condition in the thermostat of 75° C. for two weeks. It is therefore more useful to set the water content to a value of 0.05% or less by weight when the organic EL display device is used under a high temperature condition.

(3) Electrode

The following will describe the upper and lower electrodes. However, dependently on the structure of the organic EL element, the upper and lower electrodes may correspond to anode and cathode layers, respectively, or cathode and anode layers, respectively.

① Lower Electrode

The lower electrode corresponds to an anode or cathode layer dependently on the structure of the organic EL display device. In the case that the lower electrode corresponds to, for example, an anode, it is preferred to use a metal, an alloy or an electrically conductive compound having a large work function (for example, 4.0 eV or more), or a mixture thereof. Specifically, it is preferred to use one or a combination of two or more selected from indium tin oxide (ITO), indium zinc oxide (IZO), copper indium (CuIn), tin oxide ($SnO_2$), zinc oxide (ZnO), gold, platinum, palladium and so on.

By using any one of these electrode materials, the lower electrode having a uniform thickness can be made using a method making film-deposition in a dry state possible, such as vacuum evaporation, sputtering, ion plating, electron beam evaporation, CVD, MOCVD, or plasma CVD.

②  Upper Electrode

The upper electrode corresponds to an anode or cathode layer dependently on the structure of the organic EL display device. In the case that the upper electrode corresponds to, for example, a cathode, it is preferred to use a metal, an alloy or an electrically conductive compound having a smaller work function (for example, not more than 4.0 eV) than the anode layer, a mixture thereof, or an inclusion thereof.

Specifically, it is preferred to use one or a combination of two or more selected from sodium, sodium-potassium alloy, cesium, magnesium, lithium, magnesium-silver alloy, aluminum, aluminum oxide, aluminum-lithium alloy, indium, rare earth metals, mixtures of any one of these metals and an organic luminescence medium material, mixture of any one of these metals and an electron injection layer material, and so on.

(4) Intermediate Insulating Layer

The intermediate insulating layer in the organic EL display device of the first embodiment is present near or around the organic EL element (including peripheral elements such as TFT), and causes the unevenness of the luminescence medium or color filter to be flattened, so as to be used mainly as a flattened undercoat when the lower electrode of the organic EL element is formed. The intermediate insulating layer is also used to attain electric insulation for forming highly minute wiring materials, electric insulation (prevention of short circuits) between the lower and upper electrodes of the organic EL element, electrical insulation or mechanical protection of TFT, electrical insulation between TFT and the organic EL element, and so on.

In the first embodiment, therefore, the interlayer dielectric may be called a flattening film, an electrically insulating film, a partition, a spacer, an inclined member, or the like. The present invention embraces all of them.

①  Constituent Material

Examples of constituent materials used in the interlayer dielectric include acrylic, polycarbonate, polyimide, fluorinated polyimide, benzoguanamine, melamine, cyclic polyolefin, Novolak, polyvinyl cinnamate, polyvinyl chloride, polystyrene, phenol, alkyd, epoxy, polyurethane, polyester, maleic acid, and polyamide resins; and cyclic rubber.

In the case that the interlayer dielectric is composed of an inorganic oxide, examples of preferred oxides include silicon oxide ($SiO_2$ or $SiO_x$), aluminum oxide ($Al_2O_3$ or $AlO_x$), titanium oxide ($TiO_2$), yttrium oxide ($Y_2O_3$ or $YO_x$), germanium oxide ($GeO_2$ or $GeO_x$), zinc oxide (ZnO), magnesium oxide (MgO or $MgO_x$), calcium oxide (CaO), boric acid ($B_2O_3$), strontium oxide (SrO), barium oxide (BaO), lead oxide (PbO), zirconia ($ZrO_2$), sodium oxide ($Na_2O$), lithium oxide ($Li_2O$), and potassium oxide ($K_2O$), wherein x is a value within the range of 1 to 3.

② Forming Method

The method for forming the interlayer dielectric is not particularly limited. The interlayer dielectric is preferably deposited by using, for example, spin coating, casting, screen-printing, sputtering, vapor deposition, chemical vapor deposition (CVD) or ion plating.

③ Water Content

In the same as in the organic luminescence medium, the water content in the interlayer dielectric is set to preferably 0.05% or less by weight, more preferably 0.03% or less by weight, and still more preferably 0.01% or less by weight.

This is because if the water content in the interlayer dielectric is over 0.05% by weight, contained water promotes oxidization or deterioration of the upper electrode or the organic luminescence medium so that dark spots may be easily generated.

The water content in the interlayer dielectric can be measured in the same way as for the water content in the organic luminescence medium.

(5) Color Changing Medium

A color changing medium may be a color filter, a luminescence film for emitting light having a color different from EL luminescence, or a combination thereof.

① Color Filter

A color filter is set up to decompose or cut light to adjust color or improve contrast, and is composed of a colorant layer consisting only of a colorant or a lamination made by dissolving or dispersing a colorant in a binder resin.

The color filter preferably comprises blue, green and red colorants. By combining such a color filter with an organic EL element emitting white light, the three primary colors of light, blue, green and red can be obtained so that full color display can be attained.

The color filter is preferably patterned by printing or photolithography in the same was as for a luminescence medium that will be described later.

The water content in the color filter is set to preferably 0.05% or less by weight, more preferably 0.03% or less by weight, and still more preferably 0.01% or less by weight in the same way as in the organic luminescence medium.

This is because if the water content in the color filter is over 0.05% by weight, contained water promotes oxidization or deterioration of the upper electrode or the organic luminescence medium so that the generation of dark spots may not be easily suppressed.

② Fluorescence Medium

A fluorescence medium in an active driving type organic EL display device has a function of absorbing luminescence from its organic EL element to emit fluorescence having a longer wavelength, and is composed of a layered product which fluorescence medium pieces are dimensionally separated and arranged. The respective fluorescence medium pieces are preferably arranged correspondingly to luminescence areas of the organic EL element, for example, positions where the upper and lower electrodes cross each other.

Such arrangement makes it possible that the respective fluorescence medium pieces receive, when the organic luminescence layer emits light at the positions where the upper and lower electrodes cross each other, the light to take out luminescence having a different color (wavelength). Particularly in the case that the organic EL element emits blue light and the blue light can be converted to green light and red light by the fluorescence medium, the three primary colors of light, blue, green and red can be obtained even if the number of the organic EL element(s) is only one. Thus, full color display can be conventionally attained.

In the case that the fluorescence medium is made mainly of a fluorochrome, the medium is preferably deposited into a film by vacuum evaporation or sputtering through a mask making it possible to obtain a desired pattern of the fluorescence medium.

In the case that the fluorescence medium is made of a fluorochrome and a resin, it is preferred to blend, disperse or dissolve the fluorochrome in the resin to prepare a liquid, deposit the liquid into a film by spin coating, roll coating, casting or the like method, and pattern the film into a desired pattern by photolithography, screen printing or the like method to form the fluorescence medium.

The water content in the fluorescence medium is set to preferably 0.05% or less by weight, more preferably 0.03% or less by weight, and still more preferably 0.01% or less by weight in the same way as in the organic luminescence medium.

This is because if the water content in the fluorescence medium is over 0.05% by weight, contained water promotes oxidization or deterioration of the upper electrode or the organic luminescence medium so that the generation of dark spots may not be easily suppressed.

The water content in the fluorescence medium can be measured in the same way as for the water content in the organic luminescence medium.

(6) Examples of the Structure of the Organic EL Display Device

The organic EL display device of the present invention can be made by combining the above-mentioned basic constituent elements. It is also preferred to combine the constituent elements with other constituent elements such as a hole injection layer or an electron injection layer.

The following will describe typical examples of the structure of the organic EL display device, but the present invention is not limited to these examples.

Figure 4:
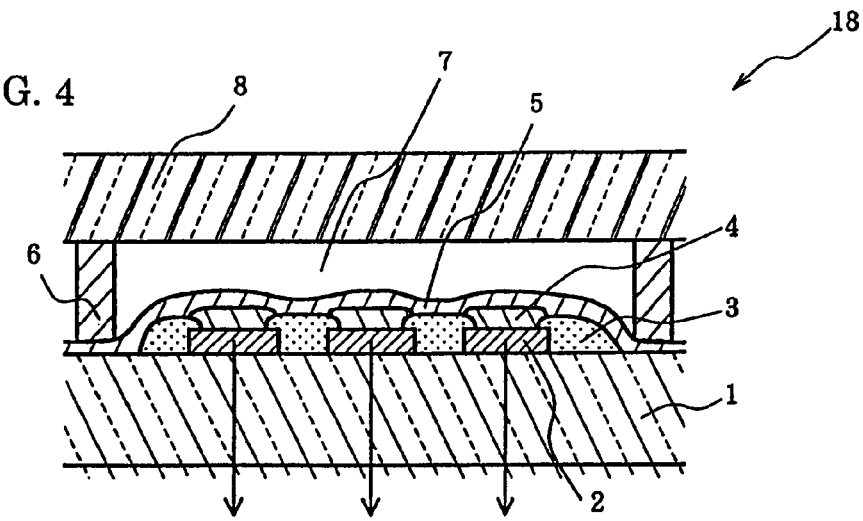
FIG. 4 is a sectional view of an organic EL display device (No. 1)
Figure 5:
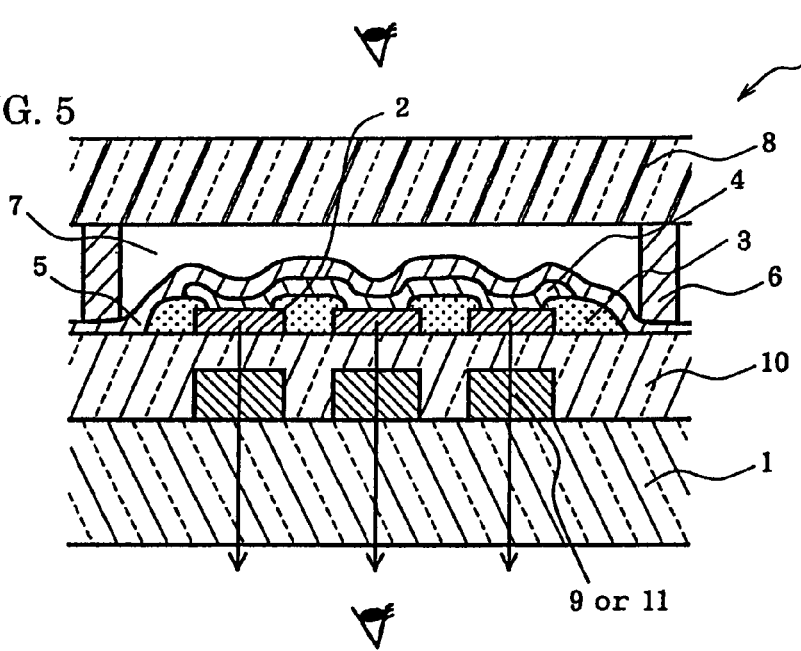
FIG. 5 is a sectional view of an organic EL display device (No. 2)
Figure 6:
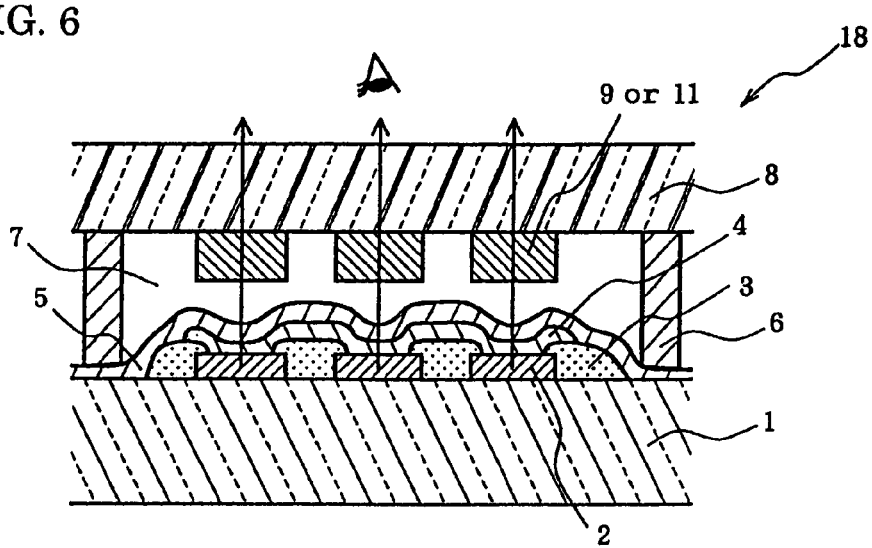
FIG. 6 is a sectional view of an organic EL display device (No. 3)
Figure 7:
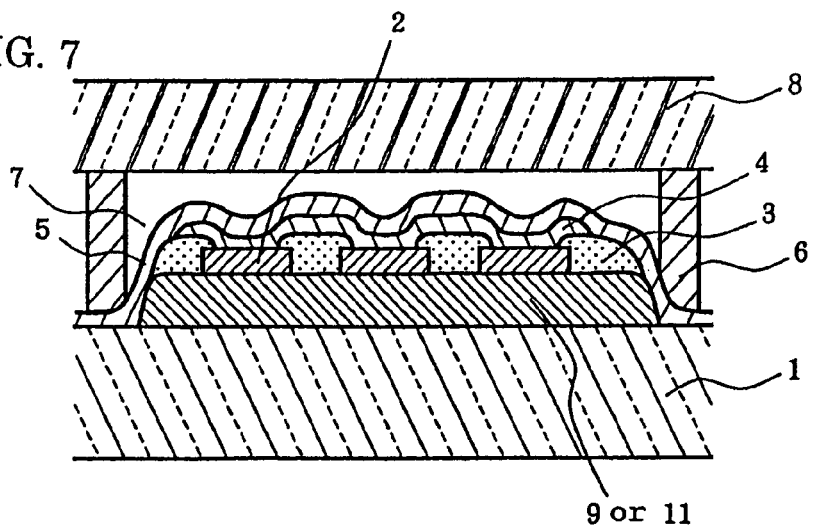
FIG. 7 is a sectional view of an organic EL display device (No. 4)
Figure 8:
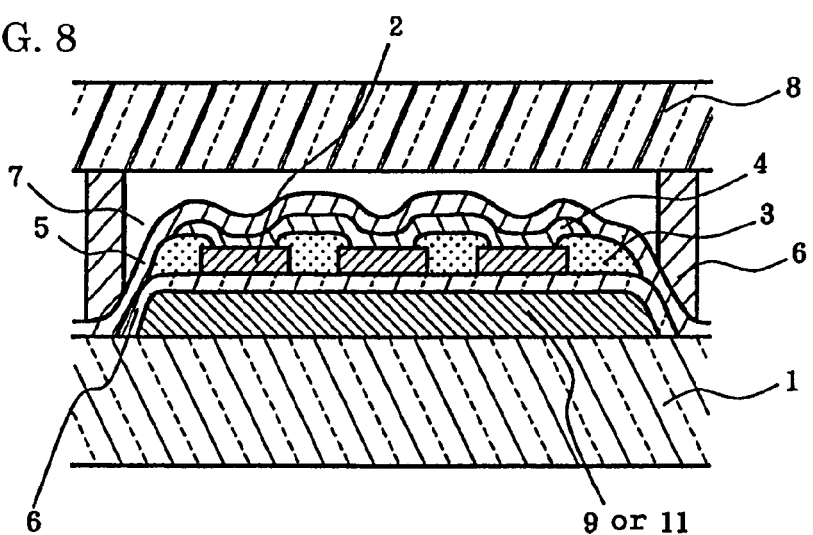
FIG. 8 is a sectional view of an organic EL display device (No. 5)
Figure 9:
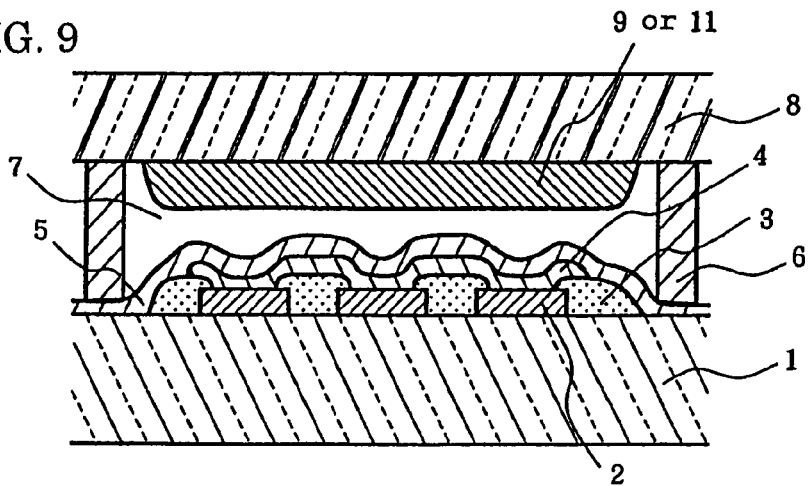
FIG. 9 is a sectional view of an organic EL display device (No. 6)

① supporting substrate/anode layer/organic luminescence layer/cathode layer/sealing member ② supporting substrate/anode layer/interlayer dielectric/organic luminescence layer/cathode layer/sealing member ③ supporting substrate/fluorescence medium/anode layer/interlayer dielectric/organic luminescence layer/cathode layer/sealing member ④ supporting substrate/fluorescence medium/flattening layer/anode layer/interlayer dielectric/organic luminescence layer/cathode layer/sealing member ⑤ supporting substrate/color filter/anode layer/interlayer dielectric/organic luminescence layer/cathode layer/sealing member ⑥ Supporting substrate/color filter/flattening layer/anode layer/interlayer dielectric/organic luminescence layer/cathode layer/sealing member ⑦ supporting substrate/color filter/fluorescence medium/flattening layer/anode layer/interlayer dielectric/organic luminescence layer/cathode layer/sealing member ⑧ supporting substrate/anode layer/organic luminescence layer/cathode layer/fluorescence medium/sealing member ⑨ supporting substrate/anode layer/organic luminescence layer/cathode layer/color filter/sealing member FIG. 4 illustrates an organic EL display device 18 that has the structure ②; FIG. 5, an organic EL display device 18 that has the structure ④ or ⑥; FIG. 6, an organic EL display device 18 that has the structure ⑧ or ⑨; FIG. 7, an organic EL display device 18 that has the structure ③ or ⑤; FIG. 8, an organic EL display device 18 that has the structure ④ or ⑥ and is a modification example of the organic EL display device 18 in FIG. 5; and FIG. 9, an organic EL display device that has the structure ⑧ or ⑨ and is a modification example of the organic EL display device 18 in FIG. 6.

Second Embodiment

Figure 16:
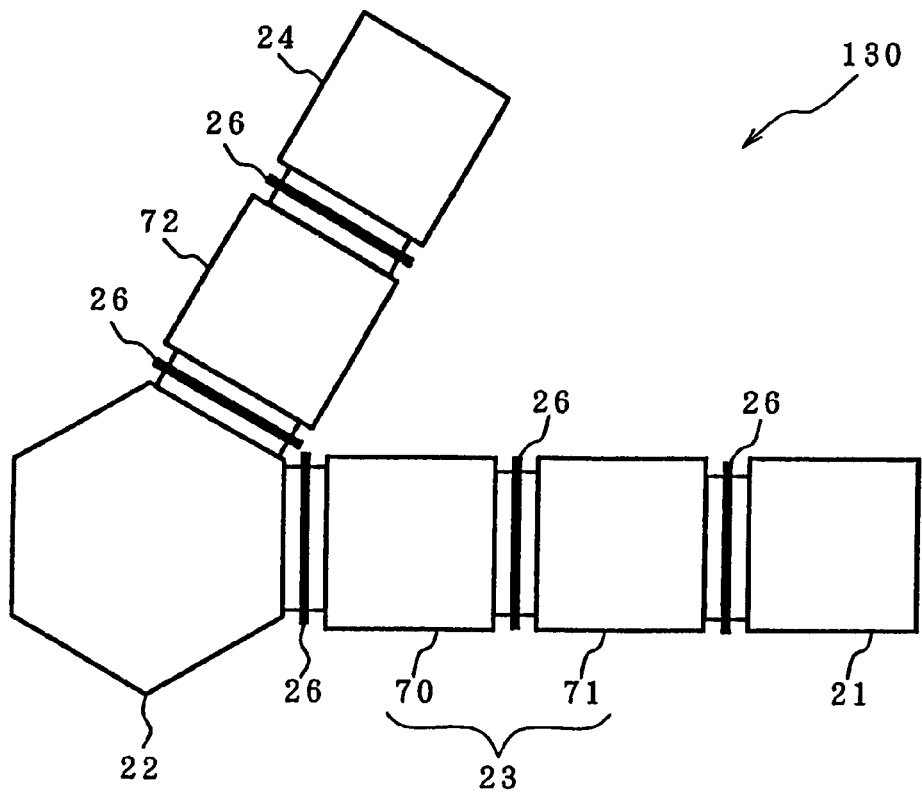
FIG. 16 is a view illustrating an apparatus for producing an organic EL display device of a second embodiment.

As is schematically illustrated in FIG. 16, an apparatus 130 for producing an organic EL display device in a second embodiment successively comprises:

a first unit (inlet) 21 for carrying a supporting substrate in, a heating room 71, in a second unit 23, for heating at least the supporting substrate before forming an organic luminescence medium, thereby performing dehydration treatment, a cooling room 70, in the second unit 23, for cooling the heated supporting substrate, a third unit 22 for forming the organic luminescence medium and an upper element, a buffer unit 72, and a fourth unit 24 for sealing the periphery of the apparatus with a sealing member, wherein carrying devices (not illustrated) are arranged between the respective units.

Referring appropriately to FIG. 16, the following will describe a characteristic structure of the producing apparatus 130 of the second embodiment, and the operation thereof.

1. Structure (1) First Unit

The first unit (inlet) 21 in the second embodiment has the same content as the first unit in the first embodiment. Explanation thereof is therefore omitted.

(2) Second Unit

The second unit (dehydrating unit) 23 in the second embodiment is composed of a heating room 71, a cooling room 70, and a connecting part 26 for connecting them to each other. Thus, the second unit 23 is different from that in the first embodiment; wherein the heating room and the cooling room are arranged in the same room.

In the case that the second unit 23 is separated in this way, a substrate can be rapidly cooled by transferring the substrate to the cooling room 70 even if the substrate is heated in a reduced-pressured state in the heating room 71.

In the case that the second unit 23 is separated in this way, the heated substrate is cooled in the cooling room 70 while a next substrate can be heated in the heating room 71. Thus, productivity can be improved.

The heating room 71 preferably comprises a heating device, a supporting base, a dry gas circulating device, a vacuum pump, a dew point hydrometer, and a full automatic absorption/desorption measuring device. The cooling room 70 preferably comprises a heating device, a supporting base, a dry gas circulating device, a vacuum pump, a dew point hydrometer, and a full automatic absorption/desorption measuring device.

(3) Third Unit

The third unit (film-deposition unit) 22 in the second embodiment has the same content as the third unit in the first embodiment. Explanation thereof is therefore omitted.

(4) Buffer Unit

The buffer unit 72 is arranged between the third and fourth units 22 and 24. This case produces an advantage that the vacuum degree in the third unit 22 can be more easily adjusted as compared with the case in which no buffer unit is arranged. In other words, sealing is usually performed in an atmospheric pressure in the fourth unit 24; therefore, if no buffer unit 72 is arranged, the vacuum degree in the third unit 22 may not be easily adjusted after the substrate is transferred from the third unit 22 in a reduced-pressured state to the fourth unit 24.

By arranging the buffer unit 72 in this way, this unit 72 can be used as a waiting place for the substrate and so on during a time between steps.

By arranging the buffer unit 72 in this way, the film-deposition state of a resultant organic EL display device, the wiring state thereof, and so on can be beforehand checked with an electric means, a microscope or the like. Thus, bad products can be taken out, through the buffer unit as a transferring outlet, without being transferred to the fourth unit 24, which is performed in the next step.

The buffer unit 72 preferably comprises an inlet, a heating device, a cooling device, a supporting base, a dry gas circulating device, a vacuum pump, a dew point hydrometer, and so on.

(5) Fourth Unit

The fourth unit (sealing unit) 24 in the second embodiment has the same content as the fourth unit in the first embodiment. Explanation thereof is therefore omitted.

2. Operation

In the case that the producing apparatus of the second embodiment is operated, a substrate is subjected to pre-treatment steps, that is, wet cleaning, infrared ray cleaning and ultraviolet ray cleaning steps, and subsequently the substrate is put on a given place in the first unit 21. In the pre-treatment steps, it is preferred to form a lower electrode, an interlayer dielectric, a fluorescence medium etc. on the substrate.

Next, a first carrying device (not illustrated) arranged between the first unit 21 and the heating room 71 in the second unit 23 is operated to transfer the substrate to the heating room 71.

Since a shutter between the first unit 21 and the heating room 71 in the second unit 23 is opened at the same time when the first carrying device is started, the first carrying device can put the substrate passing through the shutter in a designated position in the heating room 71 while grasping the substrate.

Next, when the substrate is put on the designated position, the first carrying device is returned to a given position in the first unit 21 and the shutter between the first unit 21 and the heating room 71 in the second unit 23 is shut. Heating in the heating room 71 is started.

About dehydrating conditions in the heating, it is preferred that heating temperature and heating time are, for example, from 50 to 300° C. and from 10 minutes to 24 hours, respectively, in the same way in the first embodiment. It is preferred that while the dry gas circulating device is used to adjust the dew point to −10° C. or less with the dew point hydrometer, an inert gas is introduced in a flow rate of about 10 liters/minute.

Next, the carrying device is used to transfer the dehydrated substrate to the cooling room 70. Accordingly, a shutter between the heating room 71 and the cooling room 70 is opened and the carrying device is used to transfer the substrate from the given position in the heating room 71 to a given position in the cooling room 70. The substrate is put on and the shutter between the heating room 71 and the cooling room 70 is closed to start cooling of the substrate.

Therefore, the substrate can be rapidly cooled by cooling the substrate in this way even if the substrate is heated in a reduced pressure state in the heating room 71. The cooling is continued preferably until the temperature of the substrate is lowered at least near film-deposition temperature and more preferably until the temperature is lowered near a room temperature.

Cooling conditions in the cooling room 70 are not particularly limited. For example, cooling temperature and cooling time are from 10 to 40° C. and from 10 minutes to 12 hours, respectively.

Next, it is checked that substrate temperature is lowered to a given temperature, and subsequently this substrate is transferred to the third unit (film-deposition unit) 22 by the carrying device.

The third unit 22 is used to form films of an organic luminescence medium and an upper electrode. Conditions for the film-deposition may be set to the same as in the first embodiment. Thus, details thereof are omitted.

Next, the carrying unit is used to transfer the substrate on which the organic luminescence medium and the upper electrode are formed from the third unit 22 to the buffer unit 72. Namely, the substrate is transferred from the third unit 22 in the reduced-pressured state to a given position in the buffer unit 72 in a reduced-pressured state while a shutter 26 arranged therebetween is opened.

The buffer unit 72 is arranged in this way; therefore, the vacuum degree in the third unit 22 can be kept in a given value even if a shutter between the buffer unit 72 and the fourth unit 24 is opened or shut at the time of transferring the substrate up to the fourth unit 24. In other words, a shutter is also arranged between the buffer unit 72 and the third unit 22; therefore, the vacuum degree in the third unit 22 can also be kept by adjusting the vacuum degree in the buffer unit 72 into a level equivalent to the vacuum degree in the third unit 22.

At last, from the buffer unit 72, the substrate on which the organic luminescence medium and the upper electrode are formed is transferred to the fourth unit (sealing unit) 24, using the carrying device and opening the shutter 26 therebetween.

In this case, the same sealing conditions as in the first embodiment are preferred. Specifically, in the fourth unit 24 as illustrated in FIG. 15, it is preferred to seal the substrate and the sealing member by setting an ultraviolet setting adhesive in the state in these members are pressed against each other in an inert gas.

Third Embodiment

A third embodiment is characterized in that a process for producing an organic EL display device comprises the following 1st to 4th steps.

By such a production process, the effect of external moisture and so on is excluded because of no exposure to the atmosphere, to make the adjustment of the water content easy. Moreover, the production efficiency of organic EL display devices can be further improved.

(1) First Step

A first step is the step of putting a substrate before an organic luminescence medium is formed in an inlet, which is the first unit. Dependently on the structure of a resultant organic EL display device, it is preferred that a lower electrode is beforehand formed on the substrate.

In a pre-treatment step, it is preferred that an interlayer dielectric (flattening film), a fluorescence medium, and a color filter are beforehand formed on the substrate before the substrate is put in the inlet, as the first unit, illustrated in FIG. 1.

The formation of the lower electrode on such a supporting substrate is preferably performed, using a vacuum evaporation device and so on. The formation can be performed using an apparatus for producing the above-mentioned third unit.

The respective formations of the interlayer dielectric, the fluorescence medium and the color filter are preferably performed using photolithography.

(2) Second Step

A second step is the step of removing moisture adhering to the supporting substrate, and removing, when the organic films such as the color filter, the fluorescence medium and the interlayer dielectric are formed on the supporting substrate, moisture contained in these organic films in the second unit illustrated in FIG. 11. Specifically, it is preferred to perform the following heating treatment, or this heating treatment combined with some other dehydrating treatment.

In the second step, it is also preferred to use a plasma cleaning device and an ultrasonic wave cleaning device set in the second unit at both times before and after the dehydrating treatment or either time thereof to remove impurities and dust adhering to the surface of the substrate.

① Heating Treatment

The heating temperature in the dehydrating step is preferably 40 to 300° C. The reason for this is as follows. If the heating temperature is below 40° C., dehydrating efficiency may be markedly lowered. On the other hand, if the heating temperature is over 300° C., thermal damage may be given to the organic films composed of the fluorescence film and so on.

Therefore, the heating temperature in the dehydrating step is preferably 50 to 250° C., and more preferably 60 to 200° C.

Considering the storing environment or the driving environment of the organic EL display device, it is also preferred to device the heating temperature in the dehydrating step. Specifically, the generation of dark spots can be suppressed in the storing environment or the driving environment by advance treatment at a temperature that is higher than the temperature in the storing environment or the driving environment, and preferably a temperature that is at least 10° C. higher than the above-mentioned temperature.

The dehydrating time in the case that the dehydrating treatment is conducted by heating is affected by the area or thickness of the color filter, the fluorescence medium, the first and second interlayer dielectrics and so on, but is preferably a value within the range of, for example, 10 minutes to 12 hours.

The reason for this is as follows. If the dehydrating time is below 10 minutes, the dehydrating treatment is insufficient and it may be difficult to set the water content in the formed organic luminescence medium to 0.05% or less by weight. On the other hand, if the dehydrating time is over 12 hours, the treatment time becomes long but resultant advantages may not vary.

The dehydrating time is therefore set to preferably a value within the range of 30 minutes to 10 hours and more preferably a value within the range of 1 to 6 hours.

② Introduction of an Inert Gas

It is preferred to introduce an inert gas such as helium, argon or nitrogen into the dehydrating unit in the dehydrating step to perform dehydration in such an inert gas. It is more preferred to use nitrogen since production costs fall.

By using such an inert gas, the dehydrating treatment can be conducted while reaction and oxidization of the organic layers comprising the organic luminescence medium, the cathode, and so on are suppressed. This case is therefore preferable.

In order to obtain better dehydrating effect, it is preferred that the inert gas is beforehand dehydrated.

The dehydrating time in the case that the dehydrating treatment is conducted in the inert gas is affected by an inflow speed of the inert gas, or the area and the thickness of the color filter, the fluorescence medium, the first and second interlayer dielectric, and so on. The dehydrating time is preferably set to a value within the range of, for example, 10 minutes to 40 hours.

The reason for this is as follows. If the dehydrating time is below 10 minutes, the dehydrating treatment becomes insufficient so that the water content in the formed organic luminescence medium may not be easily set to 0.05% or less by weight. On the other hand, if the dehydrating time is over 40 hours, the treatment time becomes long but resultant advantages may not vary.

Accordingly, the dehydrating time is set to preferably 30 minutes to 24 hours, and more preferably 1 to 12 hours.

③ Adjustment of the Dew Point

The dew point in the dehydrating step is set to −10° C. or lower to promote the dehydrating treatment of the substrate and so on. This is because if the dew point is over −10° C., dehydrating efficiency may be markedly lowered.

Therefore, the dew point in the dehydrating step is set to preferably −50° C. or lower, and more preferably a value within the range of −50° C. to −150° C.

The dew point in the dehydrating step can easily be set by adjusting the water content in the dehydrating unit by introducing the inert gas, lowering the vacuum degree and adjusting the temperature in the dehydrating unit while monitoring the dew point hydrometer.

The dehydrating time in the case that the dew point is set to −10° C. or lower is affected on the area or the thickness of the color filter, the fluorescence medium, the interlayer dielectric and so on. The dehydrating time is preferably set to, for example, a value within the range of 10 minutes to 40 hours.

The reason for this is as follows. If the dehydrating time is below 10 minutes, the dehydrating treatment becomes insufficient so that the water content in the formed organic luminescence medium may not be easily set to 0.05% or less by weight. On the other hand, if the dehydrating time is over 40 hours, the treatment time becomes long but resultant advantages may not vary.

Therefore, the dehydrating time is set to more preferably a value within the range of 30 minutes to 24 hours, and still more preferably a value within the range of 1 to 12 hours.

④ Adjustment of the Degree of Vacuum

The degree of vacuum in the dehydrating step is preferably a value of 13.3 Pa or less. This is because if the degree of vacuum is over 13.3 Pa, dehydrating efficiency may be markedly lowered.

Therefore, the vacuum degree is set to more preferably a value of $13.3 \times 10^{-4}$ Pa or less, and still more preferably a value within the range of $13.3 \times 10^{-4}$ to $13.3 \times 10^{-8}$ Pa.

The dehydrating time in the case that the vacuum degree in the dehydrating step is set to $13.3 \times 10^{-4}$ Pa or less is affected by the area or the thickness of the color filter, the fluorescence medium, the interlayer dielectric and so on. The dehydrating time is preferably set to, for example, a value within the range of 10 minutes to 12 hours.

The reason for this is as follows. If the dehydrating time is below 10 minutes, the dehydrating treatment becomes insufficient so that the water content in the formed organic luminescence medium may not be easily set to 0.05% or less by weight. On the other hand, if the dehydrating time is over 12 hours, the treatment time becomes long but resultant advantages may not vary.

Therefore, the dehydrating time is set to more preferably a value within the range of 30 minutes to 10 hours, and still more preferably a value within the range of 1 to 6 hours.

(3) Third Step

A third step is the step of forming an organic luminescence medium and an upper electrode in the third unit 22 illustrated in FIGS. 12 and 13.

The formation of the organic luminescence medium and the upper electrode is preferably performed by using a method making film-deposition in a dry state possible, such as vacuum evaporation or sputtering.

The following will specifically describe a method of depositing an electron injected area 14 on the substrate 203, using the vacuum deposition device 201 explained about the third unit.

The planar and square substrate 203 as illustrated in FIG. 13 is first prepared and then this substrate 203 is engaged with the holder unit 215 of the substrate holder 211 to be made into a horizontal state.

Next, in order to form the electron injected area 14, an electron transporting compound and an electron injecting material (reducing dopant) are filled into the evaporation sources 212A and 212D, respectively, which are adjacent to each other on the imaginary circle 221, and then the pressure in the vacuum tank 210 is reduced into a given vacuum degree, for example, $13.3 \times 10^{-5}$ Pa ($1.0 \times 10^{-6}$ Torr) by the exhausting means.

Next, the evaporation sources 212A and 212D are heated to evaporate the electron transporting compound and the reducing dopant simultaneously from the evaporation sources 212A and 212D, respectively. Moreover, the motor 214 is rotation-driven to rotate the substrate 203 around the rotation axis 213A at a given rate, for example, 1 to 100 rpm (revolutions per minute). In this way, the substrate 203 is rotated on its axis and simultaneously the electron transporting compound and the reducing dopant are co-evaporated to deposit the electron injected area 14.

As illustrated in FIG. 13, at this time the evaporation sources 212A and 212D are arranged a given distance M apart from the rotation axis 213A of the substrate 203 in the horizontal direction. Therefore, by the rotation of the substrate 203, the incident angle of the electron transporting compound and the reducing dopant to the substrate 203 can be regularly changed.

For this reason, it is possible to adhere the evaporation materials uniformly to substrate 203, and deposit surely a thin film having an even composition of the evaporation materials, for example, a thin film having a concentration unevenness of ±10% (mole conversion) in the film surface of the electron injected area 14.

By performing the vapor-deposition in this way, it is unnecessary to revolute the substrate 203. Thus, no space or facilities for the revolution are necessary so that the film-deposition can be economically performed in a minimum space. The revolution of the substrate means that the substrate is rotated around a rotation axis which is present outside the substrate. In this case, a wider space is necessary than in the case that the substrate rotates on its axis.

(4) Fourth Step

A fourth step is the step of covering the periphery of the organic EL element obtained at the time of the finish of the third step with a sealing member, and is preferably performed using the fourth unit illustrated in FIG. 15.

Therefore, the fourth step is preferably the step of covering the periphery of the organic EL element with the sealing member while a dry gas, for example, dry nitrogen or dry argon is circulated at a flow rate of 0.01 to 6 m²/minute in the fourth unit, and then sealing the periphery with an adhesive or the like while the sealing member is pressed.

In the case that a radical setting adhesive or a cation setting adhesive is used herein, the adhesive can be set for a short time, that is, for 10 seconds or less by radiating ultraviolet rays with an adhesive setting exposure equipment.

In the case that a thermosetting adhesive is used, the adhesive can be set for a time of 30 seconds to 1 hour by heating at 50-150° C. with a hot plate.

In the case that a moisture setting adhesive is used, the adhesive can be gradually set by exposing the adhesive to the open air after the sealing.

(5) Combination of the Respective Steps

The following will describe examples of production of an organic EL display device by combination the above-mentioned 1st to 4th steps. The present invention is not limited to these examples.

① First Combination

A first combination is steps of using a producing apparatus wherein the fourth unit is connected to the third unit, carrying a supporting substrate into the first unit, using the carrying unit to transfer the carried supporting substrate from the first unit to the second unit, heating the transferred supporting substrate in the second unit to perform dehydrating treatment, using the carrying device to transfer the dehydrated supporting substrate from the second unit to the third unit, forming an organic luminescence medium and an upper electrode in the third unit, using the carrying device to transfer the supporting substrate on which the organic luminescence medium and the upper electrode are formed from the third unit to the fourth unit, and sealing the periphery with a sealing member in the fourth unit.

By carrying out such steps, the water content in the organic luminescence medium can easily be adjusted after the organic EL display device is fabricated. Thus, the organic EL display device wherein the generation of dark spots is greatly reduced can be effectively obtained.

② Second Combination

A second combination is steps of using a producing apparatus wherein the fourth unit is connected to the first unit; and using, in the first combination, the carrying device to transfer the supporting substrate on which the organic luminescence medium and the upper electrode are formed from the third unit to the first unit, and sealing the periphery with a sealing member in the fourth unit.

By carrying out such steps, the water content in the organic luminescence medium can easily be adjusted after the organic EL display device is fabricated. Thus, the organic EL display device wherein the generation of dark spots is greatly reduced can be effectively obtained.

③ Third Combination

A third combination is steps of using a producing apparatus wherein the fourth unit is in common with the second unit; and using, in the first combination, the carrying device to transfer the supporting substrate on which the organic luminescence medium and the upper electrode are formed from the third unit to the fourth unit, which is in common with the second unit, through the first unit, and sealing the periphery with a sealing member in the fourth unit.

By carrying out such steps, the water content in the organic luminescence medium can easily be adjusted after the organic EL display device is fabricated. Thus, the organic EL display device wherein the generation of dark spots is greatly reduced can be effectively obtained.

④ Fourth Combination

A fourth combination is steps of using, in any one of the 1st to 3rd combinations, the carrying device to transfer the dehydrated supporting substrate from the second unit to the first unit, cooling the supporting substrate, and transferring the supporting substrate to the third unit.

By cooling the dehydrated supporting substrate with the first unit in this way, the supporting substrate can be effectively cooled even if the dehydrating treatment is performed in a reduced pressured state in the second unit. Thus, the time until the substrate is transferred to the third unit can be shortened.

By cooling the dehydrated supporting substrate with the first unit in this way, another substrate can be simultaneously dehydrated in the second unit. Thus, production efficiency can be improved.

⑤ Fifth Combination

A fifth combination is step of forming, in any one of the 1st to 4th combinations, an organic luminescence medium in the third unit, transferring the supporting substrate on which the organic luminescence medium is formed from the third unit to the second unit with the carrying unit, dehydrating the substrate, and transferring the substrate again from the second unit to the third unit to form an upper electrode.

By carrying out such steps, the water content in the organic luminescence medium can more easily be adjusted after the organic EL display device is fabricated. Thus, the organic EL display device wherein the generation of dark spots is greatly reduced can be effectively obtained.

⑥ Sixth Combination

A sixth combination is as follows: in any one of 1st-5th combinations, the second unit comprises a heating room and a cooling room. In the heating room, the supporting substrate is heated to be dehydrated. In the cooling room, the dehydrated supporting substrate is cooled.

By carrying out such steps, the water content in the organic luminescence medium can more easily be adjusted after the organic EL display device is fabricated. Thus, the organic EL display device wherein the generation of dark spots is greatly reduced can be effectively obtained.

EXAMPLES

Example 1

(1) Production of an organic EL element

① Formation of an Anode (Lower Electrode)

An ITO film 130 nm in thickness was formed on an entire surface of a glass substrate (OA2 glass, made by Nippon Electric glass Co., Ltd.) 112 mm in length, 143 mm in width and 1.1 mm in thickness, using a sputtering apparatus. A positive resist HPR204 (made by Fuji Hunt Electronics Technology Co., Ltd.) was applied to the ITO film by spin-coating, and this resist was dried at a temperature of 80° C. for 10 minutes.

Next, the resultant was subjected to contact-exposure to light, using a high-pressure mercury light, through a photomask having a stripe pattern (line width: 90 µm, and gap width: 20 µm). The light exposure was set to 100 mJ/cm$^2$. As a developer, tetramethylammoniumhydroxide (TMAH) was used to develop the exposed portions.

Next, the resultant was subjected to post-baking at a temperature of 130° C., using an oven. As an etchant, an aqueous solution of hydroboric acid (concentration: 47% by weight) was used to etch the ITO film. Thereafter, an exfoliating liquid N303 (made by Nagase & Co., Ltd.) was used to remove the positive resist. Thus, an ITO stripe pattern (number of lines: 960) was formed as an anode (lower electrode).

② Formation of a First Intermediate Insulating Layer

Next, a negative resist V259PA (made by Nippon Steel Chemical Co., Ltd.) was applied onto the ITO pattern by spin-coating. This resist was dried at a temperature of 80° C. for 10 minutes and the resultant was subjected to contact-exposure to light, using the high-pressure mercury light, through a photomask having a stripe pattern (line width: 90 gm, and gap width: 20 µm), which crossed the ITO pattern. The light exposure was set to 100 mJ/cm$^2$. Next, as a developer, TMAH was used to develop the unexposed portions. The resultant was subjected to post-baking at a temperature of 160° C., using the oven. Thus, a first interlayer dielectric (an opening in the ITO: 70 µm×290 µm) was formed.

③ Formation of a Second Intermediate Insulating Layer

A negative resist ZPN1100 (made by Nippon Zeon Co., Ltd.) was applied to the first interlayer dielectric by spin-coating, and this resist was dried at a temperature of 80° C. for 10 minutes, and subsequently the resultant was subjected to contact-exposure to light, using the high-pressure mercury light, through a photomask having a stripe pattern (line width: 20 µm, and gap width: 310 µm), which was parallel to the ITO pattern as the lower electrode. The light exposure was set to 100 mJ/cm$^2$.

Next, as a developer, TMAH was used to develop the unexposed portions. The resultant was subjected to post-baking at a temperature of 160° C., using an oven. Thus, a second interlayer dielectric (line width: 20 µm, gap width: 310 µm, and thickness: 5 µm) as partitions was prepared.

④ Dehydrating Step

Next, the glass substrate on which the ITO pattern and so on were formed (which may be referred merely to the glass substrate) was cleaned with isopropyl alcohol and ultraviolet rays. Thereafter, the glass substrate was put on a given position in the first unit (inlet) of the producing apparatus illustrated in FIG. 3.

Next, the carrying device (movable arm) set up to the first unit was used to transfer the glass substrate from the first unit to the second unit (dehydrating unit).

A hot plate was used to heat the glass substrate in the first unit to 60° C. While dry nitrogen was introduced thereto in this state, the dew point was lowered to −50° C. and the substrate was allowed to stand for about 2 hours. Thus, moisture in the first and second interlayer dielectrics and moisture adhering to the surface of the glass substrate and so on were removed.

⑤ Formation of an Organic Luminescence Medium

Next, the heating of the hot plate was stopped so that the temperature of the glass substrate dropped to room temperature. Thereafter, the carrying device set in the first unit was used to transfer the dehydrated substrate from the second unit to the third unit (vacuum deposition device) via the first unit and fix the substrate to the substrate holder illustrated in FIG. 13.

Heating boards in the third unit were beforehand filled with the following materials: hole injection material: 4,4',4"-tris[N-(3-methylphenyl)-N-phenylamino]triphenylamine (MT-DATA), and 4,4'-bis[N-(1-naphthyl)-N-phenylamino]-biphenyl(NPD)

organic luminescence material: 4,4'-bis(2,2-diphenylvinyl)terphenyl (DPVTP)

electron injecting material: tris(8-quinolinol)aluminum (Alq)

upper electrode material: Al—Li alloy (Li concentration: 10% by atom)

Next, the vacuum degree in the third unit was reduced to $665 \times 10^{-7}$ Pa, and an organic luminescence medium (a hole injection layer, an organic luminescence layer and an electron injection layer) and an upper electrode were successively deposited without breaking from the formation of the hole injection layer to the formation of the upper electrode, in such a manner that the following vapor deposition rate and thickness would be generated.

MTDATA: vapor deposition rate=0.1 to 0.3 nm/sec., thickness=60 nm,

NPD: vapor deposition rate=0.1 to 0.3 nm/sec., thickness=20 nm,

DPVTP: vapor deposition rate=0.1 to 0.3 nm/sec., thickness=40 nm,

Alq: vapor deposition rate=0.1 to 0.3 nm/sec., thickness=20 nm, and

Al—Li: vapor deposition rate=0.5 to 1.0 nm/sec., thickness=150 nm.

⑥ Sealing Step

Next, the carrying device set in the first unit was used to transfer the glass substrate on which the organic luminescence medium and the upper electrode were formed from the third unit to the fourth unit (sealing unit), which was in common with the second unit, via the first unit.

In the fourth unit, a sealing glass substrate (blue glass, made by Geomatec Co., Ltd.) was deposited on the upper electrode, and subsequently a photo-curing type adhesive TB3102 (made by Three Bond Co., Ltd.) was used to seal the periphery thereof by hardening the adhesive through ultraviolet ray exposure. Thus, an organic EL display device for measuring luminescence performance was produced.

Under the same production conditions, an organic EL display device for measuring the water content and an organic EL display device for a durability test were produced.

(2) Evaluation of the Organic EL Device

① Measurement of the Water Content

The resultant organic EL display device was decomposed inside a dry box wherein dry nitrogen was continuously introduced, and a spatula was used to collect the organic luminescence medium. (The medium comprised a part of the intermediate insulating layer. The same fact is correspondingly applied to the following.) Moreover, a full automatic absorption/desorption measuring device IGA SORP (made by Hiden Analytical Ltd. in England) set in the dry box was used to measure the weight of the organic luminescence medium. As a result, the weight A of the organic luminescence medium was 43.9194 mg.

Next, the collected organic luminescence medium was heated at 75° C. in the dry box for 30 minutes and then the weight of the heated medium was measured with the full automatic absorption/desorption measuring device. As a result, the weight B of the heated organic luminescence medium was 43.9190 mg.

The resultant weights A and B were introduced into the calculating equation to calculate the water content (W (%)) in the organic luminescence medium. As a result, the water content (W) in the organic luminescence medium was 0.0009% by weight.

Namely, it was demonstrated that the setting of the second unit (dehydrating step) before the formation of the organic luminescence medium to remove moisture from the surface of the supporting substrate and the first and second interlayer dielectrics was an effective manner for lowering the water content in the organic luminescence medium.

② Measurement of Luminescence Performance

A DC voltage of 10 V was applied between the lower electrode (ITO pattern, anode) and the upper electrode (cathode) in the resultant organic EL display device to cause respective pixels (about 230,000 pixels), which were portions where the electrode patterns crossed each other, to emit light. A Chroma Meter CS100 (made by Minolta Co., Ltd.) was used to measure the luminescence brightness so that a value of 300 cd/m² was obtained. The numerical aperture, which is the percentage of the area of the pixels in the total area of the luminescence surface, was 56%.

Under the same conditions, the respective pixels of the organic EL display device were caused to emit light and then the CIE chromaticity was measured so that blue luminescence whose CIEx was 0.15 and whose CIEy was 0.18 in the CIE chromaticity coordinates was obtained.

③ Durability Test

The resultant two organic EL display devices were allowed to stand at room temperature (25° C.) in the atmosphere and at 75° C. in a thermostat, respectively, for two weeks. Thereafter, respective pixels of the organic EL display device were caused to emit light under the above-mentioned voltage condition to measure the area of region emitting the light appropriately, where no dark spot was generated. (This region will be referred to as the luminescence region hereinafter.) The area of the luminescence region was compared with the area of the luminescence region before the storage, to evaluate durability.

When the area of the luminescence region before the storage was regarded as 1, the area of the luminescence region after the storage was 0.98 in the case that the organic EL display device was allowed to store at room temperature (25° C.) in the atmosphere. The area of the luminescence region after the storage was 0.97 in the case that the organic EL display devices was allowed to stand at 75° C. in the thermostat.

Namely, it was demonstrated that by setting the water content in the organic luminescence medium to a given value (0.05% by weight) or less, it was possible to suppress a reduction in the luminescence area by the generation of dark spots for a long time not only under the condition of room temperature (25° C.) in the atmosphere but also under the condition of the high temperature of 75° C.

Comparative Example 1

An organic EL display device was produced and evaluated in the same manner as in Example 1 except that no dehydrating treatment was conducted by the second unit before the organic EL element was formed. The obtained results are shown in Table 1.

As can be understood from the results, the water content in the organic luminescence medium was 0.0713% by weight, and could not be lowered to 0.05% or less by weight since no dehydrating step was used.

In the case that the resultant organic EL display device was allowed to stand at room temperature (25° C.) in the atmosphere for 2 weeks and at 75° C. in a thermostat for 2 weeks, the luminescence area ratios (the above-mentioned areas of the luminescence region) were 0.80 and 0.55, respectively.

Namely, it was demonstrated that because no dehydrating treatment was conducted before the formation of the organic element, it was impossible to set the water content in the organic luminescence medium to 0.05% or less by weight and it was difficult to suppress a reduction in the luminescence area by the generation of dark spots under the condition of room temperature (25° C.) in the atmosphere and under the condition of the high temperature of 75° C.

Example 2

An organic EL display device was produced and evaluated in the same manner as in Example 1 except that a red filter and a fluorescence medium were formed before the formation of the organic EL element and further the material for forming the lower electrode was changed from ITO to IZO. The obtained results are shown in Table 1.

As can be understood from the results, the water content in the organic luminescence medium was 0.0385% by weight, which was somewhat higher than that of Example 1, because the step of forming the red filter and the fluorescence medium would be necessary.

However, even if the resultant organic EL display device was allowed to stand at room temperature (25° C.) in the atmosphere for two weeks and at 75° C. in a thermostat for two weeks, the luminescence area ratios were 0.9 or more, respectively. Namely, it was demonstrated that it was possible to suppress the generation of dark spots in Example 2 by conducting the dehydrating treatment in the dehydrating step.

Comparative Example 2

An organic EL display device was produced and evaluated in the same manner as in Example 2 except that no dehydrating treatment was conducted by the second unit before the organic EL element was formed. The obtained results are shown in Table 1.

As can be understood from the results, the water content in the organic luminescence medium was 0.3215% by weight, and could not be lowered to 0.05% or less by weight since no dehydrating step was used.

In the case that the resultant organic EL display device was allowed to stand at room temperature (25° C.) in the atmosphere and at 75° C. in a thermostat, the luminescence area ratios were 0.33 and 0.15, respectively. Namely, it was demonstrated that because no dehydrating treatment was conducted before the formation of the organic element, it was impossible to set the water content in the organic luminescence medium to 0.05% or less by weight and it was difficult to suppress a reduction in the luminescence area by the generation of dark spots under the condition of room temperature (25° C.) in the atmosphere and under the condition of the high temperature of 75° C.

TABLE 1

| | | Example 1 | Comparative Example 1 | Example 2 | Comparative Example 1 |
|---|---|---|---|---|---|
| Organic EL display device | Color filter | None | None | Formed | Formed |
| | Fluorescence medium | None | None | Formed | Formed |
| | Anode (lower electrode) | ITO | ITO | IZO | IZO |
| | Hole injection layer | MTDATA/NPD | MTDATA/NPD | MTDATA/NPD | MTDATA/NPD |
| | Luminescence layer | DPVTP | DPVTP | DPVTP | DPVTP |
| | Electron injection layer | Alq | Alq | Alq | Alq |
| | Cathode (upper electrode) | Al/Li | Al/Li | Al/Li | Al/Li |
| | Sealing glass substrate | Formed | Formed | Formed | Formed |
| | Dehydrating step | Dew point: 1–50° C., $N_2$, heating to 60° C. | None | Dew point: –50° C., $N_2$, heating to 60° C. | None |
| Initial | ① Water content | 0.0009 | 0.0713 | 0.0009 | 0.3215 |
| | ② Luminescence brightness | 300 | 300 | 70 | 70 |
| | ③ CIEx | 0.15 | 0.15 | 0.65 | 0.65 |
| | ④ CIEy | 0.18 | 0.18 | 0.32 | 0.32 |
| Room temperature for 2 weeks | ⑤ Luminescence area ratio | 0.98 | 0.80 | 0.94 | 0.33 |
| | ⑥ Luminescence brightness (cd/m$^2$) | 294 | 240 | 65.8 | 23.1 |
| 75° C. for 2 weeks | ⑦ Luminescence area ratio | 0.97 | 0.55 | 0.91 | 0.15 |
| | ⑧ Luminescence brightness (cd/m$^2$) | 291 | 165 | 63.7 | 10.5 |

Unit: Water content (% by weight)
Luminescence brightness (cd/m$^2$)

Example 3

An organic EL display device was produced and evaluated in the same manner as in Example 1 except that a producing apparatus comprising a dehydrating unit composed of a heating room and a cooling room as illustrated in FIG. 16 was used instead of the producing apparatus illustrated in FIG. 3.

In other words, the glass substrate on which the first and second interlayer dielectrics were formed was subjected to cleaning with isopropyl alcohol and ultraviolet rays, and then this glass substrate was put in a given position in the first unit (inlet) of the producing apparatus illustrated in FIG. 16.

Next, the carrying device (movable arm) set in the first unit was used to transfer the glass substrate from the first unit to the heating room of the second unit (dehydrating unit). A hot plate was used to heat the glass substrate in the heating room to 60° C. While dry nitrogen was introduced thereto in this state, the dew point was lowered to −50° C. The glass substrate was allowed to stand for 2 hours to remove moisture in the first and second interlayer dielectrics and moisture adhering to the surface of the glass substrate and so on.

Next, the carrying device (movable arm) was used to transfer the glass substrate that was still heated to 60° C. from the heating room to the cooling room. While dry nitrogen was introduced thereto, the glass substrate in the cooling room was brought into contact with a stainless steel cooling plate (temperature: 10° C.) for 30 minutes to lower the temperature of the glass substrate to room temperature (25° C.).

As a result, the water content in the organic luminescence medium in the organic EL display device obtained in Example 3 was 0.0009% by weight. In the same way in Example 1, the organic EL display device was caused to emit light so that the luminescence brightness was 300 cd/m² and blue luminescence whose CIEx was 0.15 and whose CIEy was 0.18 was obtained.

Even if the resultant organic EL display device was allowed to stand at room temperature (25° C.) in the atmosphere for 2 weeks and at a high temperature of 75° C. for 2 weeks, the ratios of the resultant luminescence areas to the initial value thereof were 0.98 and 0.97, respectively.

Namely, it was demonstrated that by setting the water content in the organic luminescence medium to a given value or less through the dehydrating treatment in the dehydrating step in Example 3, it was possible to suppress the generation of dark spots.

It was also made sure that since the dehydrating unit composed of the heating room and the cooling room was used, the processing for lowering the substrate after the dehydrating treatment, which required about 2 hours in Example 1, required only 30 minutes; thus, the processing could be very promptly performed and the organic EL display device could be effectively produced.

Example 4

An organic EL display device was produced and evaluated in the same manner as in Example 1 except that the substrate dehydrated before the film-deposition was cleaned with plasma in the third unit.

In other words, argon and oxygen were used as plasma gas, and the flow rates thereof were set to 200 sccm and 75 sccm, respectively. Moreover, the pressure at the time of the plasma cleaning was set to 1.18 Pa, the output of the high frequency wave (13.56 MHz) was set to 50 W, and the time for the plasma cleaning was set to 10 minutes.

As a result, the water content in the organic luminescence medium in the organic EL display device obtained in Example 4 was 0.0009% by weight. In the same way in Example 1, the organic EL display device were caused to emit light so that the luminescence brightness was 300 cd/m² and blue luminescence whose CIEX was 0.15 and whose CIEy was 0.18 was obtained.

Even if the resultant organic EL display device was allowed to stand at room temperature (25° C.) in the atmosphere for 2 weeks and at a high temperature of 75° C. for 2 weeks, the ratios of the resultant luminescence areas to the initial value thereof were 0.99 and 0.98, respectively.

Namely, it was demonstrated that by setting the water content in the organic luminescence medium to a given value or less through the dehydrating treatment in the dehydrating step in Example 4 and cleaning the substrate dehydrated before the film-deposition with plasma, it was possible to suppress the generation of dark spots more effectively.

INDUSTRIAL APPLICABILITY

As described above, according to the apparatus for producing an organic EL display device of the present invention, by setting the second unit for dehydrating a substrate and so on positively, the water content in its organic luminescence medium can be lowered. Specifically, an organic EL display device having a water content of 0.05% or less by weight can be effectively obtained. Therefore, even if the organic EL display device is driven for a long time not only under a room temperature condition but also under a high temperature condition, the generation of dark spots, which are non-luminescence areas, can be effectively suppressed.

According to the organic EL display device producing apparatus of the present invention, by connecting the second unit for conducting dehydrating treatment to the third unit for conducting a film-deposition step through the first unit as an inlet, conveniences and productive efficiency can be improved.

According to the organic EL display device producing apparatus of the present invention, by using an evaporation device having plural evaporation sources in the third unit for conducting a film-deposition step or by making the second unit for conducting dehydrating treatment in common with the fourth unit for performing a sealing step, the organic EL display device can easily be made small-sized.

According to the process for producing an organic EL display device of the present invention, by using the step of dehydrating a substrate and so on, an organic EL display device wherein the generation of dark spots and the like can be suppressed can be effectively obtained even if the organic EL display device is driven in a high temperature environment for a long time.

Therefore, an organic EL display device which is superior in endurance and has a size of 2 to 30 inches can be effectively obtained. Thus, the device can be widely used as a display device for the people's livelihood, such as a small-sized display portable terminal (portable telephone), a display device adapting for car, an instrument panel device, a car navigator, a notebook-size personal computer; or a display device for industries, such as an office automation display device, a factory automation display device or a monitor for measurement devices.

What is claimed is:

1. A process for producing an organic electroluminescence display device comprising a lower electrode, an organic luminescence medium, and an upper electrode, the periphery of the device being sealed with a sealing member, the process comprising the steps of:
    carrying a supporting substrate into a first unit;
    transferring the carried-in supporting substrate from the first unit to a second unit by using a carrying device;
    heating the transferred supporting substrate in the second unit to conduct a dehydrating treatment;
    transferring the dehydrated supporting substrate from the second unit to a third unit by using a carrying device;
    forming the organic luminescence medium and the upper electrode by a vapor depositing device, a sputtering device, an ion plating device, an electron beam evaporation device, a chemical vapor deposition device, a metal oxide chemical vapor deposition device or a plasma enhanced chemical vapor deposition device in the third unit;

transferring the supporting substrate on which the organic luminescence medium and the upper electrode are formed from the third unit to a fourth unit by using a carrying device; and sealing the periphery of the organic electroluminescence display device with the sealing member in the fourth unit.

2. The process for producing the organic electroluminescence display device of claim 1, further comprising cooling the dehydrated supporting substrate in the second unit, after the heating step.

3. The process for producing the organic electroluminescence display device of claim 1, wherein the step of transferring the supporting substrate from the second unit to the third unit comprises transferring the dehydrated supporting substrate from the second unit to the third unit through the first unit.

4. The process for producing the organic electroluminescence display device of claim 1, wherein the step of transferring the supporting substrate from the third unit to the fourth unit comprises transferring the supporting substrate on which the organic luminescence medium and the upper electrode are formed from the second unit to the third unit through the first unit.

5. The process for producing the organic electroluminescence display device according to claim 1, wherein the step of transferring the supporting substrate from the second unit to the third unit comprises:

transferring the supporting substrate from the second unit to the first unit, cooling the supporting substrate in the first unit, and transferring the supporting substrate from the first unit to the third unit.

6. The process for producing the organic electroluminescence display device according to claim 1, wherein the step of forming the organic luminescence medium and the upper electrode comprises;

forming the organic luminescence medium in the third unit, transferring the supporting substrate from the third unit to the second unit, dehydrating the supporting substrate in the second unit, transferring the supporting substrate from the second unit to the third unit again, and forming the upper electrode in the third unit.

7. A process for producing an organic electroluminescence display device comprising a lower electrode, an organic luminescence medium, and an upper electrode, the periphery of the device being sealed with a sealing member, the process comprising the steps of:

carrying a supporting substrate into a first unit;

transferring the carried-in supporting substrate from the first unit to a second unit by using a carrying device;

heating the transferred supporting substrate in the second unit to conduct a dehydrating treatment;

transferring the dehydrated supporting substrate from the second unit to a third unit by using a carrying device;

forming the organic luminescence medium and the upper electrode by a vapor depositing device, a sputtering device, an ion plating device, an electron beam evaporation device, a chemical vapor deposition device, a metal oxide chemical vapor deposition device, or a plasma enhanced chemical vapor deposition device in the third unit;

transferring the supporting substrate on which the organic luminescence medium and the upper electrode are formed from the third unit to the second unit through the first unit by using a carrying device; and sealing the periphery of the organic electroluminescence display device with the sealing member in the second unit.

* * * * *